United States Patent

Kuwaoka

[11] Patent Number: 5,926,121
[45] Date of Patent: Jul. 20, 1999

[54] SIGNAL PROCESSING APPARATUS

[75] Inventor: Toshiharu Kuwaoka, Yokohama, Japan

[73] Assignee: Victor Company Of Japan, Ltd., Yokohama, Japan

[21] Appl. No.: 08/959,081

[22] Filed: Oct. 28, 1997

[51] Int. Cl.$^6$ ................................................. H03M 7/00
[52] U.S. Cl. ...................................... 341/100; 341/95
[58] Field of Search ........................... 341/100, 59, 95, 341/55, 102

[56] References Cited

U.S. PATENT DOCUMENTS

| | | | |
|---|---|---|---|
| 5,206,646 | 4/1993 | Sako et al. | 341/95 |
| 5,592,161 | 1/1997 | Kuwaoka | 341/95 |
| 5,606,317 | 2/1997 | Cloonan et al. | 341/58 |
| 5,638,070 | 6/1997 | Kuwaoka | 341/95 |

FOREIGN PATENT DOCUMENTS 05304424  11/1993  Japan .

*Primary Examiner*—Brian Young
*Attorney, Agent, or Firm*—Jacobson, Price, Holman & Stern, PLLC

[57] ABSTRACT

A signal processing apparatus transforms N-bit coded data into M-bit coded data, where M is larger than N. The N-bit coded data is obtained by converting an analog signal into a digital signal in the resolution of $\frac{1}{2^N}$. First cyclic data of K number sequential N-bit coded data of a sampling period Ts/K is generated in response to input N-bit coded data of a sampling period Ts, where K is a natural number of two or more. The first cyclic data is processed to output second cyclic data of K number sequential M-bit coded data of the sampling period Ts/K.

23 Claims, 21 Drawing Sheets

| | 1 1 1 1 |
|---|---|
| INTERPOLATION BETWEEN #1 AND #2 | INTERPOLATION BETWEEN #2 AND #3 |
| ⊓ | – |
| ⊔ | – |
| 1~2 LINEAR | 2~3 LINEAR |
| 1.5~2 LINEAR | 2~3 LINEAR |
FIG. 11A
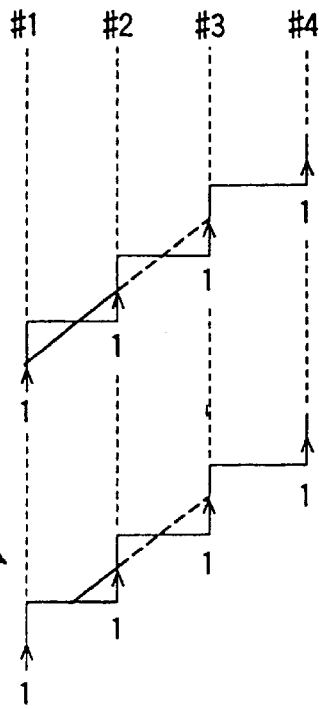
FIG. 11B
| | 1 1 1 0 |
|---|---|
| INTERPOLATION BETWEEN #1 AND #2 | INTERPOLATION BETWEEN #2 AND #3 |
| ⊓ | – |
| ⊔ | – |
| 1~2 LINEAR | 2~2.5 LINEAR |
| 1.5~2 LINEAR | 2~2.5 LINEAR |
FIG. 12A
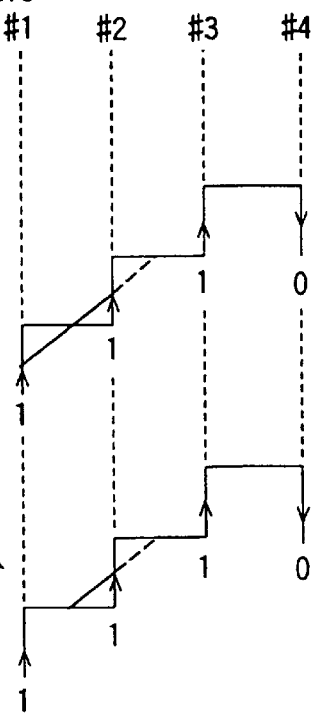
FIG. 12B

SIGNAL PROCESSING APPARATUS

BACKGROUND OF THE INVENTION

The present invention relates to a signal processing method and a signal processing apparatus, and more specifically to a method and apparatus for transforming N-bit coded data such as audio signals, video signals, etc. into M-bit coded data on condition that M is larger than N.

In the case where signals such as audio or video signals are converted into digital signals, digital signals having a predetermined number of bits are generated per sample in conformity with a standard prescribed under due consideration of various conditions (e.g., transmission, fidelity of recording and reproduction, apparatus cost, etc.). For instance, in the case of a compact disk, 16-bit digital signals are recorded per sample.

In FIG. 1, a plurality of thick solid lines S as a→b →c→d→ . . . k→l→m→n, represent digital signals obtained by quantizing an original analog signal (by resolution of $\frac{1}{2}^N$ per specific sampling period Ts) in a form of analog signal. Here, the original analog signal resides in the ranges enclosed by dashed lines including the solid lines S shown in FIG. 1. In other words, there exists an error of less than ±0.5 LSB (the least significant bit) between the original analog signal and the restored analog signal (obtained by restoring the original analog signal). Therefore, in the N-bit digital signal obtained by converting the analog signal in the resolution of $\frac{1}{2}^N$, the minute signal as fine as obtained by the resolution more that $\frac{1}{2}^N$ cannot be restored. Further, in FIG. 1, t1, t2, t3, . . . denote sequential sampling points, and Ts denotes a sampling period.

However, there exists so far a need of restoration of the minute signal by a resolution more than a value determined by the number of bits of digital signals. Therefore, for instance, Japanese Laid-Open Patent No. 5(1993)-304474 has proposed such a method of transforming N-bit coded data into M-bit coded data on condition that M is larger than N. In a technique of increasing the number of bits disclosed in this patent, digital signals are smoothed through a digital low-pass filter so that even the minute level signals can be converted by Digital-to-Analog (DA) conversion without distortion. In other words, data less than one LSB of the original number of bits can be output for DA conversion.

In this technique, although the N-bit digital signals are converted into M-bit digital signals (M>N) by use of the digital low-pass filter, it is impossible to correct the errors of 0.5 LSB involved in the N-bit digital signals. In addition, since the digital low-pass filter is used for waveform smoothing, the signal waveform changes. As a result, when this method is applied to the DA conversion of audio digital signals, for instance, there exists a problem in that the quality of the audio digital signals varies.

In order to solve this problem, the applicant of the present application has proposed the following method:

In the case where N-bit coded data obtained by converting analog signals into digital signals in the resolution of $\frac{1}{2}^N$ are converted into M-bit coded data, n-bit coded data to be subjected to bit number conversion that sequentially appear by one sampling period are detected with respect to their transitions.

In detail, firstly, it is determined on two continuous first and second N-bit coded data whether a digital value of the first N-bit coded data that precedes the second coded data on the time axis is larger, smaller than or equal to that of the second coded data to generate the first (larger), the second (smaller) and the third (equal) detection outputs, respectively.

Secondly, it is determined on the output train of the sequential first and second detection outputs whether a transitional pattern of every four outputs (one output group) is classified into which of predetermined transitional patterns of digital value.

Thirdly, the following operation is executed on N-bit coded data of a plurality of the sequential output groups, each group being composed of the sequential first to fourth digital value transition points, to conduct linear interpolation by means of the digital signal in the resolution of $\frac{1}{2}^N$: a linear interpolation to be applied in a period between the second and the third digital value transition points in one output group is decided with respect to the linear interpolation already applied in a period between the first and the second digital value transition points.

Then, an additional signal of (M–N) bits is obtained by means of the digital signal in the resolution of $\frac{1}{2}^N$ in the following way: the linear interpolation is applied in the period as described above such that an area of a rectangle formed per digital transition point on the time axis in which digital value transition corresponds to one least significant bit (LSB) of the resolution of $\frac{1}{2}^N$ is almost equal to an area of a figure formed by the rectangle and a line of the digital signal in the resolution of $\frac{1}{2}^N$. The additional signal of (M–N) bits is added to an N-bit coded data at its LSB to generate an M-bit coded data.

The above method is illustrated by FIG. 2A. In detail, 1 LSB of the resolution of $\frac{1}{2}^N$ is composed of points w→x→a→u→v→r→y→z. The linear interpolation is executed on the original digital signal so that a triangle of the points a→u→i and a triangle of the points r→v→i become equal to each other to obtain the digital signal in the resolution of $\frac{1}{2}^N$. The additional signal of (M–N) bits is obtained by means of the digital signal in the resolution of $\frac{1}{2}^N$. Therefore, an information signal can be obtained that is highly quality compared to a digital signal formed by a conventional bit conversion technique.

The triangles of the points a→u→i and the points r→v→i are equal to each other as described above. However, an actual digital signal in the resolution of $\frac{1}{2}^N$ is not obtained so as to correspond to the line a→r shown in FIG. 2B but discretely obtained on the time axis per sampling period. Therefore, the triangles of the points a→u→i and r→v→i are actually become polygons b→c→d→e→f→g→h→u and r→v→i→j→k→m→n→p→q, respectively, as shown in FIGS. 2A to 2C. FIGS. 2B and 2C are enlarged views of portions shown in FIG. 2A.

There is room for improvement in this method because the two polygons have different areas therebetween. Therefore, the applicant of the present application has proposed a information signal processing apparatus to modify the additional signal of (M–N) bits with an offset value that makes shift, by one half of the sampling period, the step-like waveform of the digital signal in the resolution of $\frac{1}{2}^N$ is obtained by linear interpolation.

However, in this method, linear interpolation cannot be executed when N-bit coded data to be subjected to bit conversion sequentially appear per sampling period Ts have various digital values per sampling period.

Therefore, There is still room for improvement in this method.

SUMMARY OF THE INVENTION

The object of the present invention is to obtain high-quality signals, such as audio signals and/or video signals in a high resolution on the basis of the digitalized audio and/or video signals.

To achieve the above-mentioned object, the present invention provides a signal processing apparatus for transforming N-bit coded data into M-bit coded data, where M is larger than N, the N-bit coded data being obtained by converting an analog signal into a digital signal in the resolution of ½$^N$, the apparatus comprising: a generator to generate first cyclic data of K number sequential N-bit coded data of a sampling period Ts/K in response to input N-bit coded data of a sampling period Ts, where K is a natural number of two or more; and a processor to process the first cyclic data to output second cyclic data of K number sequential M-bit coded data of the sampling period Ts/K.

Further, the present invention provides a signal processing apparatus for transforming N-bit coded data into M-bit coded data, where M is larger than N, the N-bit coded data being obtained by converting an analog signal into a digital signal in the resolution of ½$^N$, the apparatus comprising: a sampler to sample input N-bit coded data of a sampling period Ts to generate sequential odd number N-bit coded data of a sampling period Ts/K and sequential even number N-bit coded data of the sampling period Ts/K, where K is a natural number of two or more; a generator, based on the sequential odd number N-bit coded data and the sequential even number N-bit coded data, to generate first cyclic data of odd number N-bit coded data and second cyclic data of even number N-bit coded data, respectively; a processor to process the first and the second cyclic data to generate third cyclic data of odd number sequential M-bit coded data of the sampling period Ts/K and fourth cyclic data of even number sequential M-bit coded data of the sampling period Ts/K, respectively; and a selector to sequentially and alternatively select the third and the fourth cyclic data to output fifth cyclic data of K number sequential M-bit coded data of the sampling period Ts/K.

Further, the present invention provides a signal processing method of transforming N-bit coded data into M-bit coded data, where M is larger than N, the N-bit coded data being obtained by converting an analog signal into a digital signal in the resolution of ½$^N$, the method comprising the steps of: generating first cyclic data of K number sequential N-bit coded data of a sampling period Ts/K in response to input N-bit coded data of a sampling period Ts, where K is a natural number of two or more; and processing the first cyclic data to output second cyclic data of K number sequential M-bit coded data of the sampling period Ts/K.

BRIEF DESCRIPTION OF THE DRAWINGS

FIG. 11 shows a table and waveform diagrams for assistance in explaining linear interpolation performed by the additional signal generator of the signal processing apparatus according to the present invention;

FIG. 12 shows a table and waveform diagrams for assistance in explaining the linear interpolation according to the present invention;

DETAILED DESCRIPTION OF THE EMBODIMENTS

Preferred embodiments of the apparatus according to the present invention will be described hereinbelow with reference to the attached drawings.

Figure 3A:
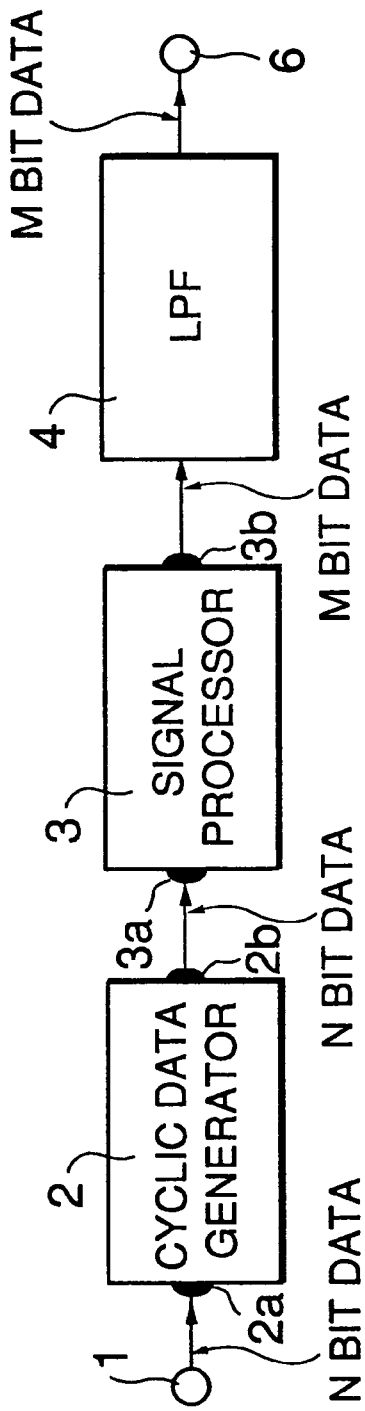
FIGS. 3A and 3B are block diagrams showing the first and the second embodiment of the signal processing apparatus according to the present invention.
Figure 3B:
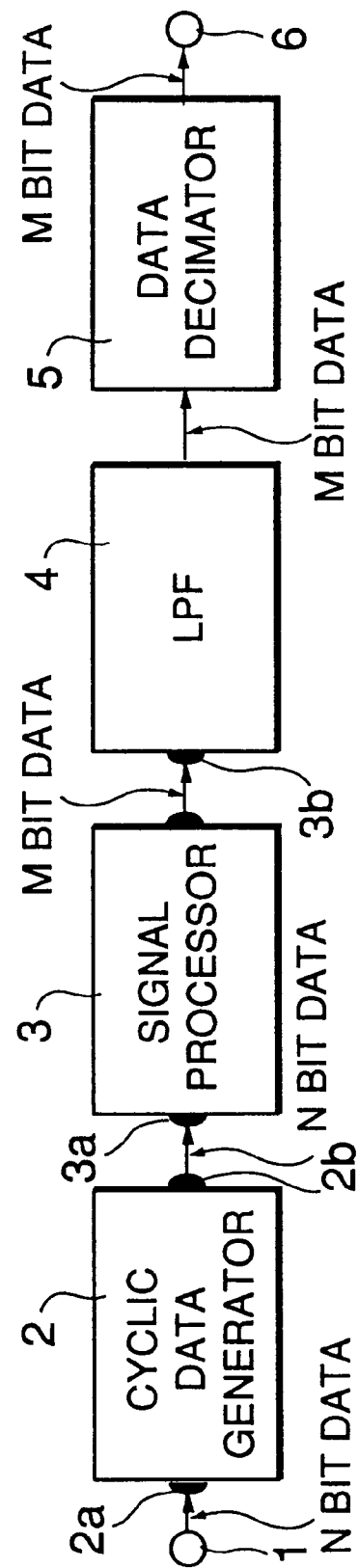

FIGS. 3A and 3B show block diagrams of the first and the second embodiments of the signal processing apparatus according to the present invention, respectively.

Figure 5:
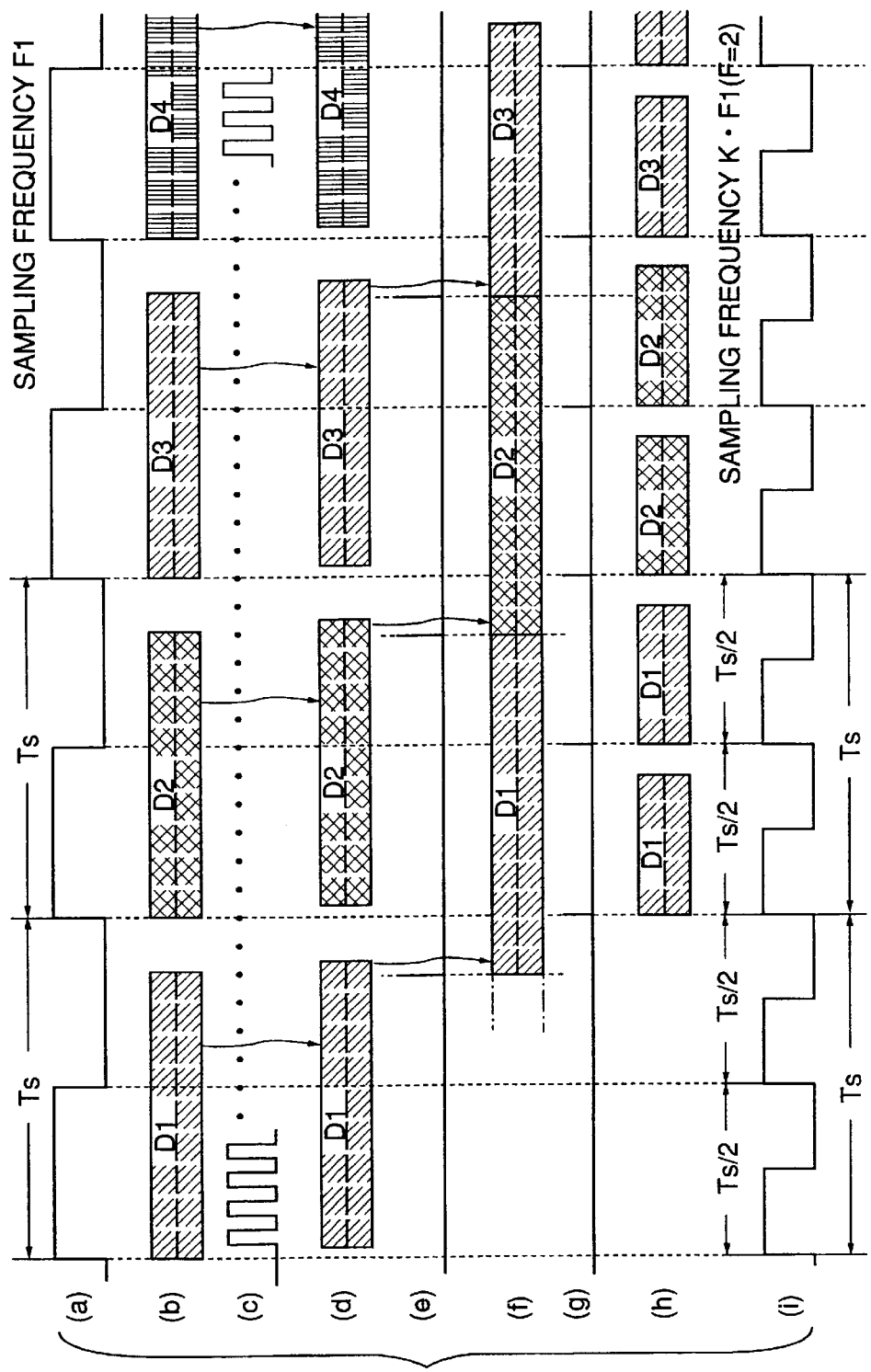
FIG. 5(a) to FIG. 5(i) are a series of waveform diagrams for assistance in explaining the operation of the cyclic data generator shown in FIG. 4.

In FIGS. 3A and 3B, N-bit coded data to be processed of sampling period Ts shown in FIG. 5(a) are supplied to a cyclic data generator 2 via input terminal 1. The generator 2 generates cyclic data of K number sequential N-bit coded data of sampling period of Ts/K. The number K is a natural number of two or more. FIG. 5(i) shows sequential N-bit coded data of sampling period of Ts/2 (K=2). Here, the embodiments below will be discussed in the case where K=2.

Figure 4:
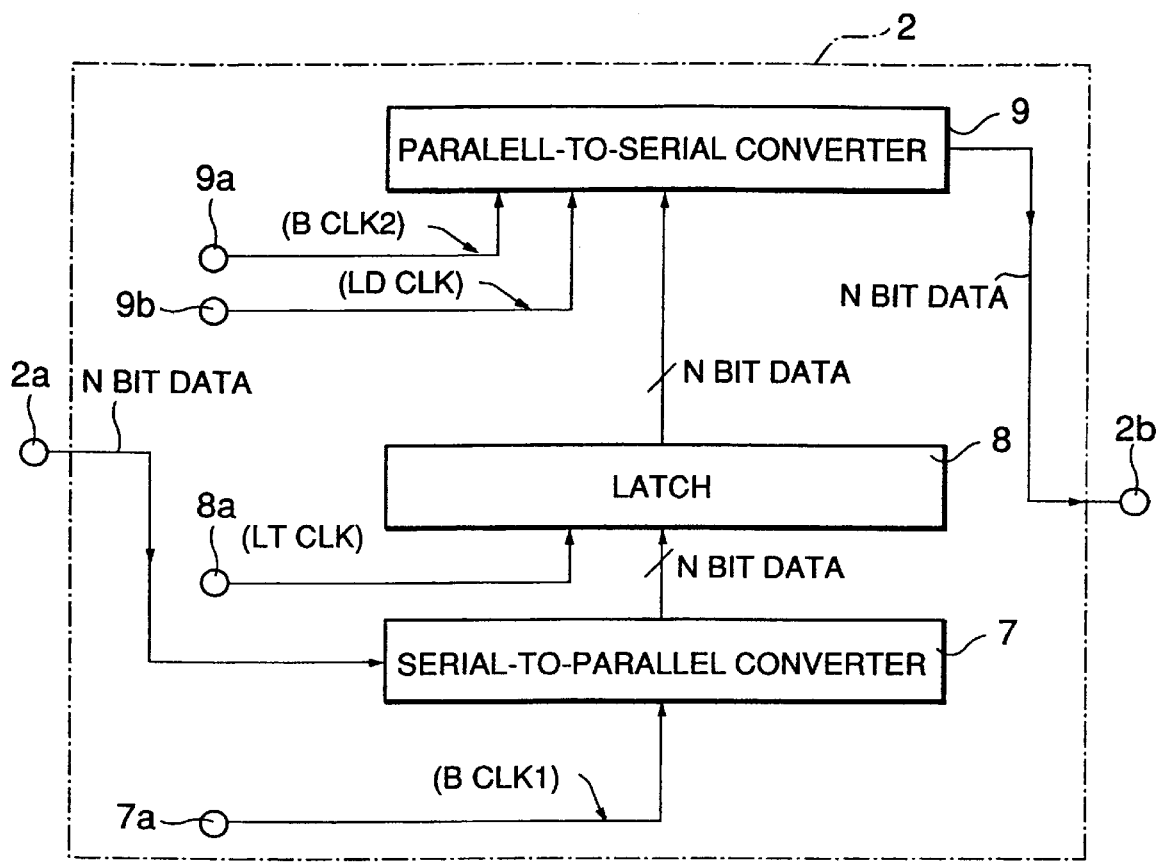
FIG. 4 is a block diagrams showing the cyclic data generator of the signal processing apparatus according to the present invention.

FIG. 4 shows a block diagram of the cyclic data generator 2 to which the N-bit coded data (N-bit data) to be processed of sampling period Ts are supplied via input terminal 2a.

Further, FIG. 5(b) shows N-bit coded data D1, D2, D3, D4, ..., (digital data of N-bit serial digital signals) supplied to the cyclic data generator 2 per sampling period of Ts shown in FIG. 5(a).

The N-bit serial digital signals are sequentially supplied to a serial-to-parallel convertor 7 with bit clocks B CLK1 shown in FIG. 5(c). At a moment when it is finished that the converter 7 accepts the digital data D1, the digital data D1 is supplied to a latch memory 8 as N-bit parallel digital signals as shown in FIG. 5(h). This signal transfer also sequentially happens to the digital data D2, D3, D4, ..., and so on. And, hence the discussion below will be made only for the digital data D1.

The latch memory 8 stores the digital data D1 as the N-bit parallel digital signals with latch clocks LT CLK shown in FIG. 5(e) at a moment when it is finished that the serial-to-parallel convertor 7 accepts the digital data D1 as the N-bit serial signals. And, the latch memory 8 holds the stored the N-bit digital data D1 as shown in FIG. 5(f) until the following latch clock LT CLK is supplied thereto.

Then, the latch memory 8 reads the N-bit data D1 twice (in the case of K=2) during the period Ts and supplies it to a parallel-to-serial converter 9.

The converter 9 loads the stored N-bit data D1 per load clock LD CLK of Ts/2 (in the case of K=2), shown in FIG. 5(g), supplied thereto. Also supplied to the converter 9 are bit clocks B CLK2 of period that is half the cyclic period of the bit clocks B CLK1 supplied to the serial-to-parallel converter 7 in the case of K=2. Then, the converter 9 outputs the N-bit data D1, via output terminal 2b, of sampling period Ts/2 twice (in the case of K=2) during the period Ts as shown in FIG. 5(h).

Figure 6:
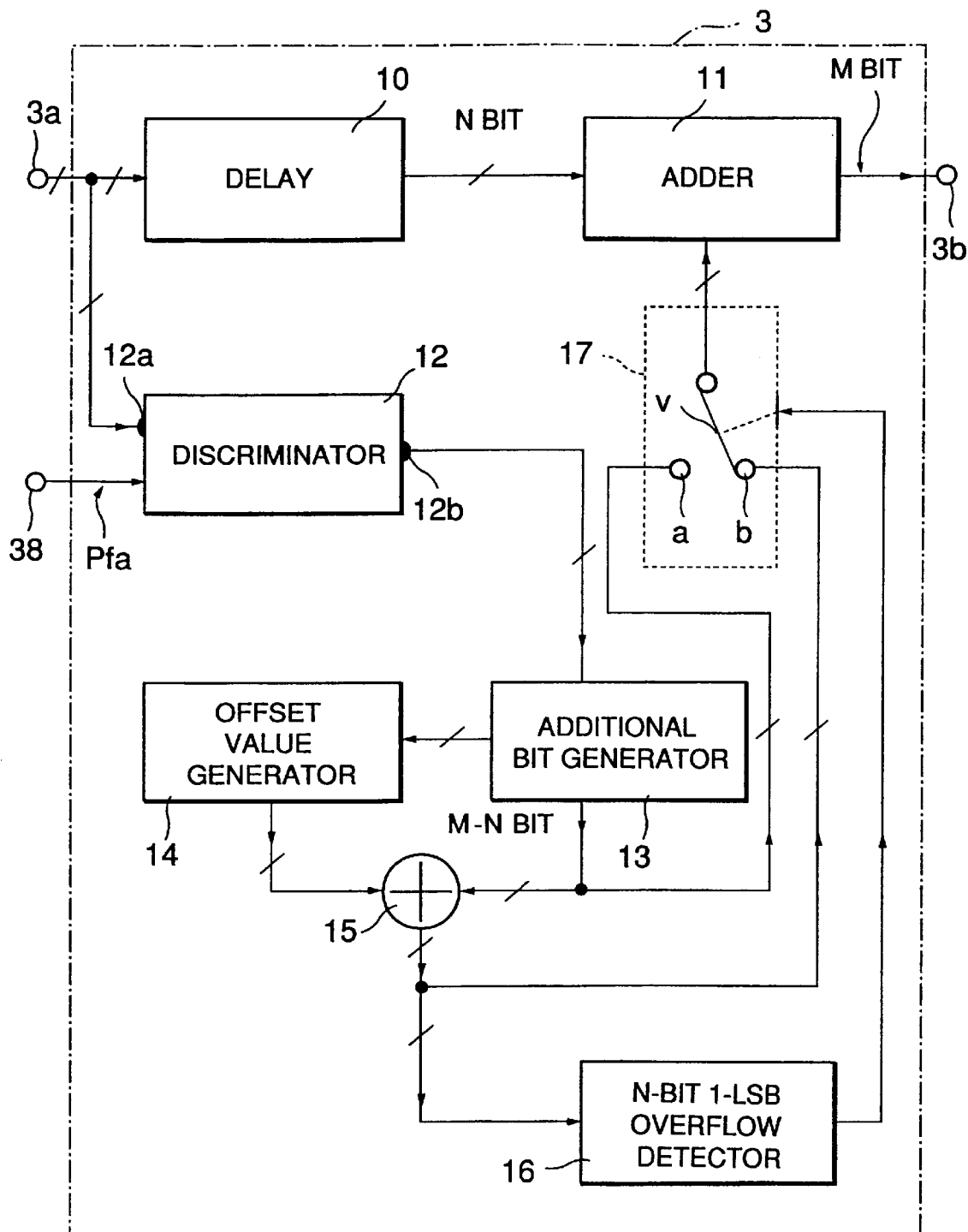
FIG. 6 is a block diagrams showing the signal processor of the signal processing apparatus according to the present invention.

Here, in FIGS. 3A and 3B, a signal processor 3 to process signals for improving coded data resolution connected to the cyclic data generator 2 is shown in FIG. 6. The processor 3 shown in FIG. 6 accepts N-bit parallel data. Therefore, N-bit parallel data D1 of sampling period Ts/2 are output twice (in the case of K=2) during the period Ts via output terminal 2b of the generator 2 to the processor 3.

Figure 7A:
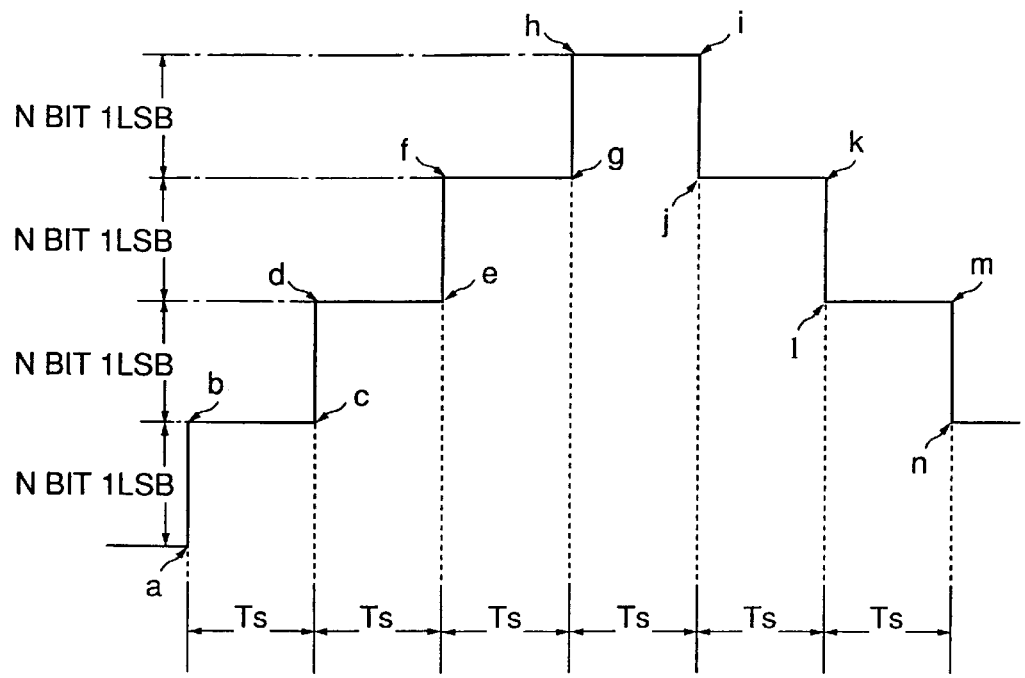
FIGS. 7A and 7B are waveform diagrams for assistance in explaining the operation of the signal processor shown in FIG. 6.
Figure 7B:
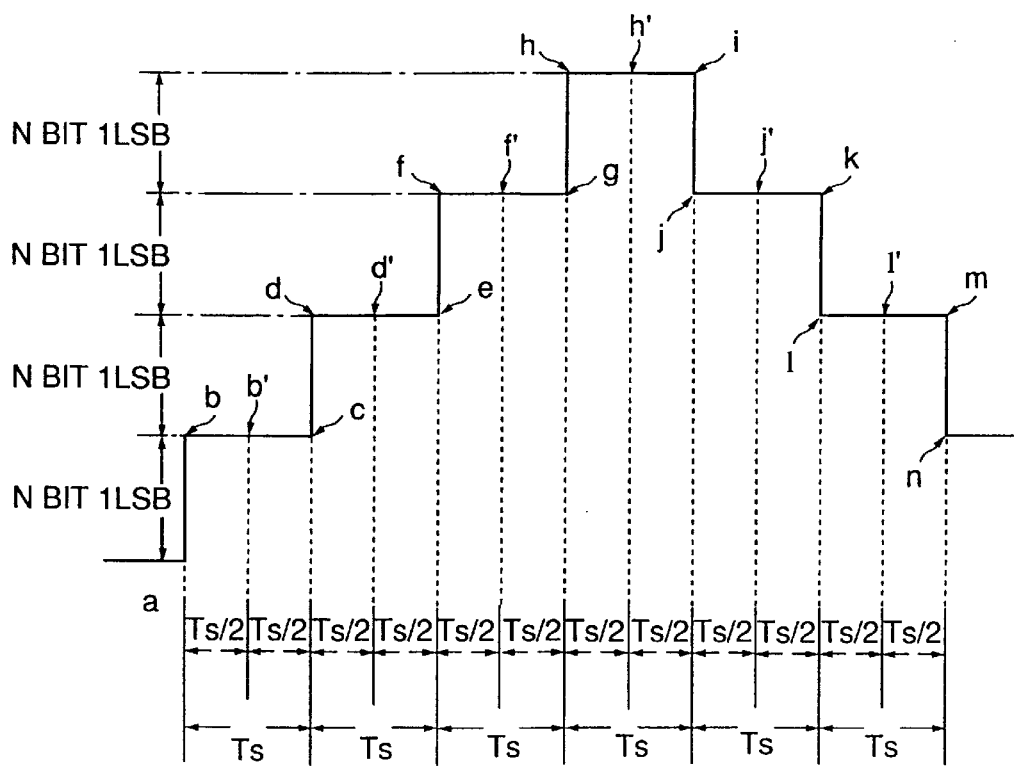

FIG. 7A illustrates transition of sequential digital values a→b→d→f→h→i→k→m→n that is identical to the transition of sequential digital values shown in FIG. 7B. Here, FIG. 7A shows the transition of the N-bit digital data of sampling period Ts, on the other hand, FIG. 7B the transition of the N-bit digital data of sampling period Ts/2. Further, in FIG. 7B, digital values of the points b', d', f', h', j', l' among the points a→b→b'→d→d'→f→f'→h→h'→i→i'→j'→k→l'→m→n are also the digital values of N-bit digital data of sampling period Ts/2. This is different from the N-bit digital data of sampling period Ts shown in FIG. 7A.

Therefore, the signal processor 3 does not apply linear interpolation to the N-bit coded data of sampling period Ts when digital values thereof are changing as shown in FIG. 7A. On the other hand, the processor 3 effectively applies linear interpolation to the N-bit coded data of sampling period Ts/2 (K=2) when digital values thereof are changing as shown in FIG. 7B.

Figure 23A:
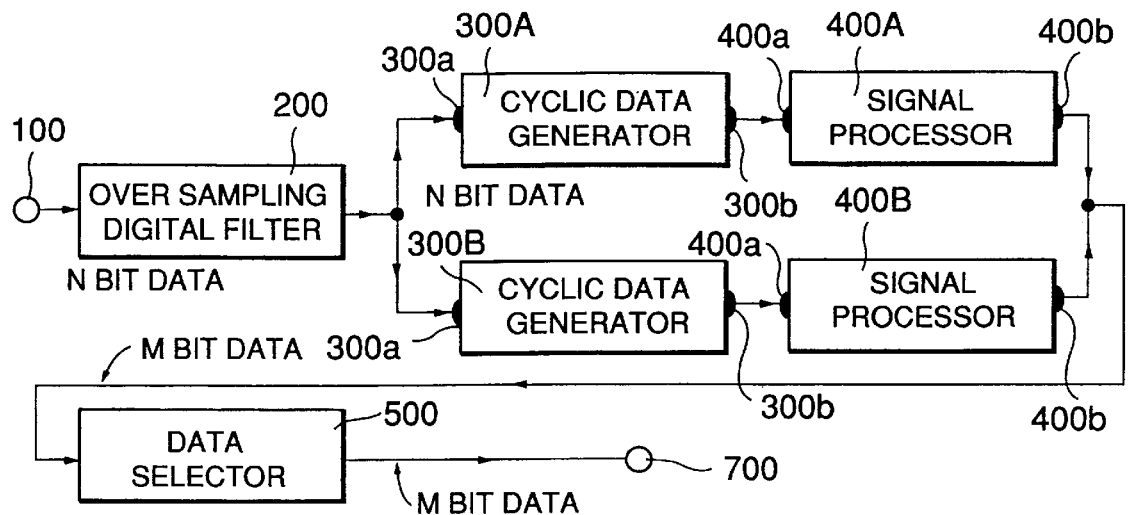
FIGS. 23A and 23B are block diagrams showing the third and the fourth embodiments of the signal processing apparatus according to the present invention.
Figure 23B:
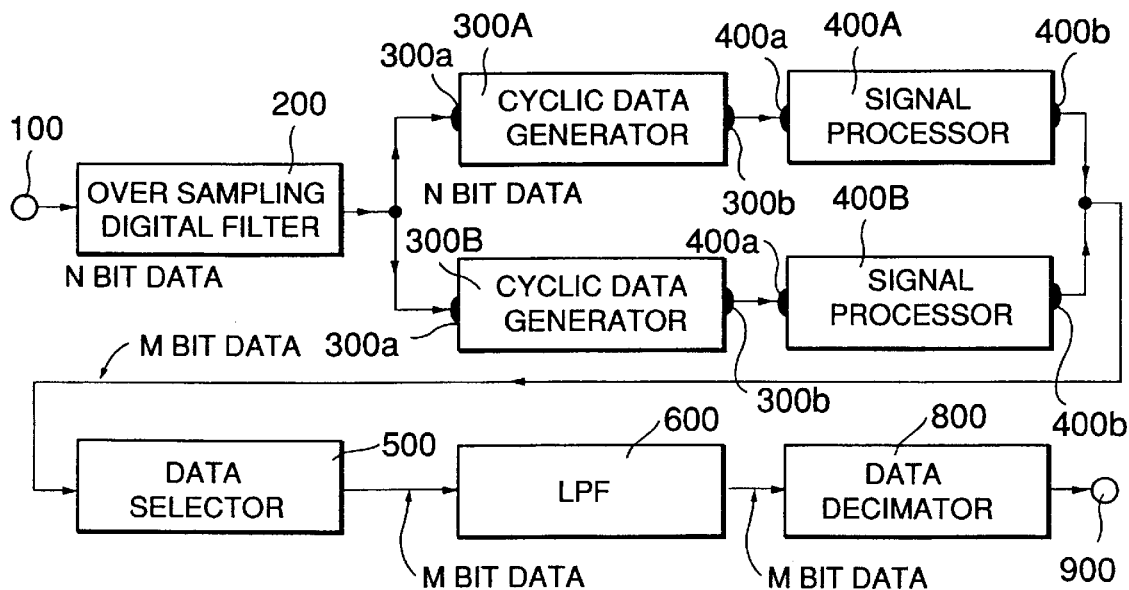

FIGS. 7A and 7B will also be used to illustrate input and output data to and from an oversampling filter 200 shown in FIGS. 23A and 23B that show the third and the fourth embodiments, respectively, of the signal processing apparatus according to the present invention.

The signal processor 3 to process signals for improving coded data resolution will be described further in detail with respect to FIG. 6.

In FIG. 6, K number of N-bit coded data (N-bit digital signals) of sampling period Ts/K (here, K being a natural number of two or more) as cyclic data is supplied from the cyclic data generator 2 to the signal processor 3 via input terminal 3a.

The following description will be made in the case where K is 2, that is, the sampling period Ts/K of the N-bit coded data supplied to the processor 3 is Ts/2.

The N-bit coded data supplied via input terminal 3a is supplied to a delay unit 10 and further to a discriminator 12, via input terminal 12a, for detecting signal waveform transition and discriminating transition pattern. Also supplied to the discriminator 12 are pluses Pfs of period Ts/2 via input terminal 38.

The discriminator 12 detects the signal waveform transition and discriminates the signal transition pattern to supply the detection and determination results to an (M–N) additional bit signal generator 13. In response to the results, the generator 13 generates (M–N) bit signals that are supplied to an adder 15 and a switch 17 at the fixed contact point a thereof. The generator 13 further supplies M bit digital signals that have been generated and linearly interpolated during generation of the (M–N) bit signals and other necessary information to an offset value generator 14.

The generator 14 generates an offset value to make the step-like waveform of the linearly interpolated M bit digital signals shifted by half of the sampling period Ts/2. The offset value is then supplied to the adder 15.

The adder 15 adds the (M–N) bit signals and offset value to supply the addition output to the switch 17 at the contact point b thereof and an N-bit 1-LSB overflow detector 16.

The detector 16 generates a switching control signal when the digital signals supplied from the adder 15 becomes larger than N-bit 1-LSB. In response to the switching control signal, the movable contact point v of the switch 17 that has touched the fixed contact point b is switched so that the contact point v touches the fixed contact point a of the switch 17.

The movable contact point v of the switch 17 is connected to an adder 11. Thus, the (m–N) bit signals generated by the generator 13 is supplied to the adder 11 via fixed and movable contact points a and v. The (m–N) bit signals are added to the N-bit coded data supplied from the delay unit 10 so that the (m–N) bit signals follow the last significant bit of the N-bit coded data to form M-bit coded data. The M-bit coded data is output from the signal processor 3 via out put terminal 3b.

Figure 8:
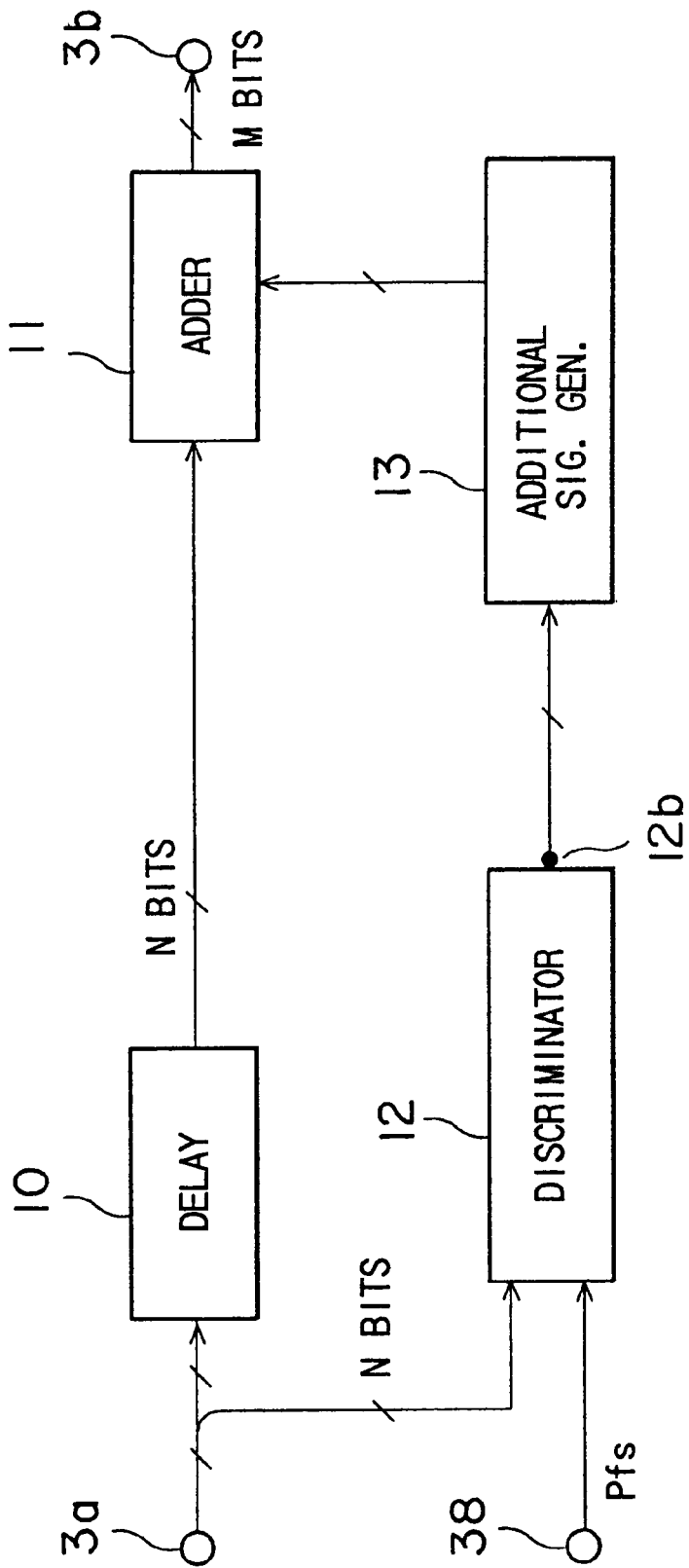
FIG. 8 is another block diagrams showing the signal processor of the signal processing apparatus according to the present invention.

FIG. 8 shows a block diagram of another configuration of the signal processor 3. FIG. 8 shows that the (m–N) bit signals generated by the (M–N) additional bit generator 13 is directly supplied to the adder 11.

In FIG. 8, the reference numeral 3a denotes an input terminal of the N-bit coded data (N-bit digital signals) to be processed. In the case where the N-bit digital signals are of serial data, a serial-to-parallel converter is provided at the front stage of the input terminal 3a.

In FIG. 8, the N-bit digital signals supplied to the input terminal 3a are supplied to the delay circuit 10 and to the discriminator 12. Further, clock pulses Pfs having the sampling frequency of the digital signals are supplied to the discriminator 12 through the input terminal 38.

The discriminator 12 discriminates the signal transition pattern of the N-bit digital signals to be processed, and transmits the discriminated result to the additional signal generator 13. On the basis of the discriminated results of the signal transition pattern supplied from the discriminator 12, the generator 13 executes predetermined calculations to generate the (M–N)-bit additional signals. The obtained additional signals are supplied to the adder 11. The adder 11 adds the (M–N)-bit additional signal to the N-bit digital signals (as the N-bit corresponding to higher significant bits of the M bits), and the obtained M-bit digital signals are output through the output terminal 3b.

With reference to FIGS. 9 to 20C, the signal processor will be explained more in detail.

Figure 9A:
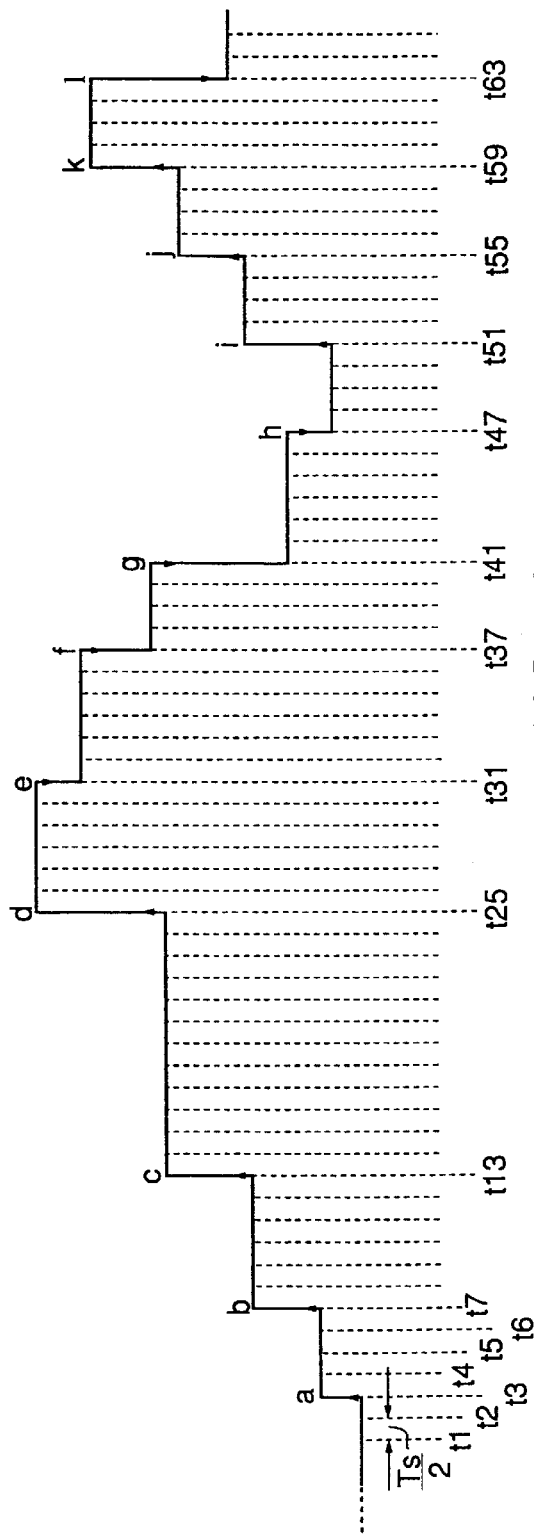
FIGS. 9A to 9C are waveform diagrams for assistance in explaining the operation of the signal processor according to the present invention.

FIG. 9A shows the digital values of the N-bit digital signals of the sampling period Ts/2 (K=2) in the form of analog manner at the time points t1, t2, t3, . . . . Till the time point t2, the same digital values are kept, and the digital value varies markedly at time point t3. This timing point t3 is referred to as a transition point "a". Points "b" to "1" are also transition points at which the digital values are varying. The digital value does not vary between two transition points, for example, between the points "a" and "b", "b" and "c", "c" and "d", . . . , and "k" and "1".

The digital values have a tendency to increase at the transition point "a" at the time point t3, "b" at t7, "c" at t13, "d" at t25, "i" at t51, "j" at t55, and "k" at t59. This increase is indicated by upward arrows. On the other hand, the digital values have a tendency to decrease at the transition point "e" at the time point t31, "f" at t37, "g" at t41, "h" at t47, "1" at t63. This decrease is indicated by downward arrows.

Figure 9B:
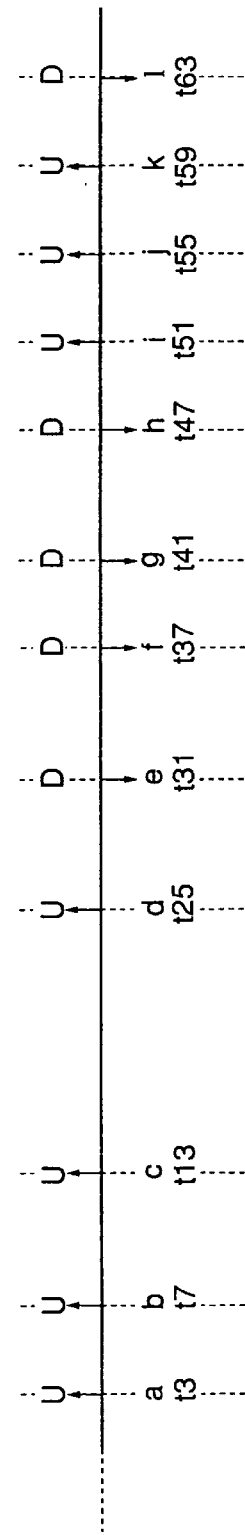

FIG. 9B illustrates the transition status of the N-bit digital values per transition point in which the increase at the transition points "i" to "d" and "i" to "k" are indicated by upward arrows with the character "U", on the other hand, the decrease at "e" to "h" and "1" by downward arrows with the character "D".

Figure 9C:
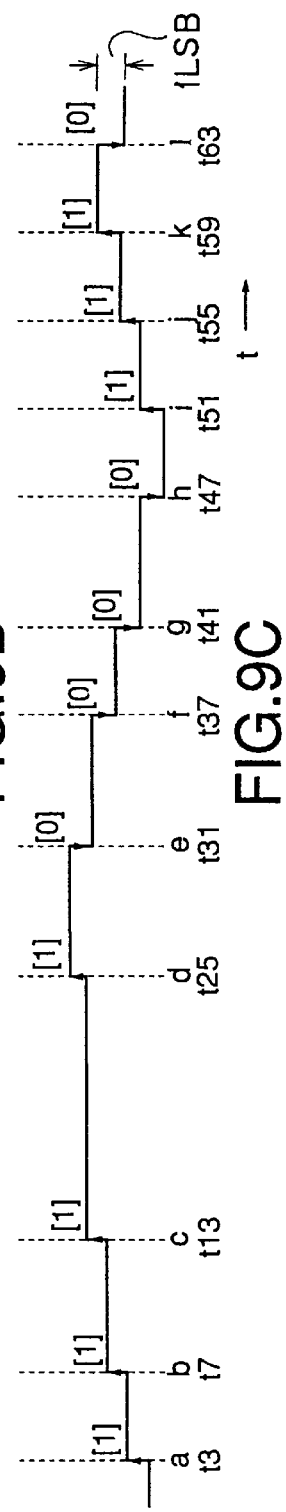

Further, FIG. 9C illustrates the transition status of the N-bit digital values in which the signal levels increase by a predetermined same one step (resolution one LSB of $½^N$) without respect to increase amounts of the digital values at the transition points "a" to "d" and "i" to "k", on the other hand, decrease by a predetermined same one step (resolution one LSB of $½^N$) without respect to decrease amounts of the digital values at "e" to "h" and "1".

Figure 1:
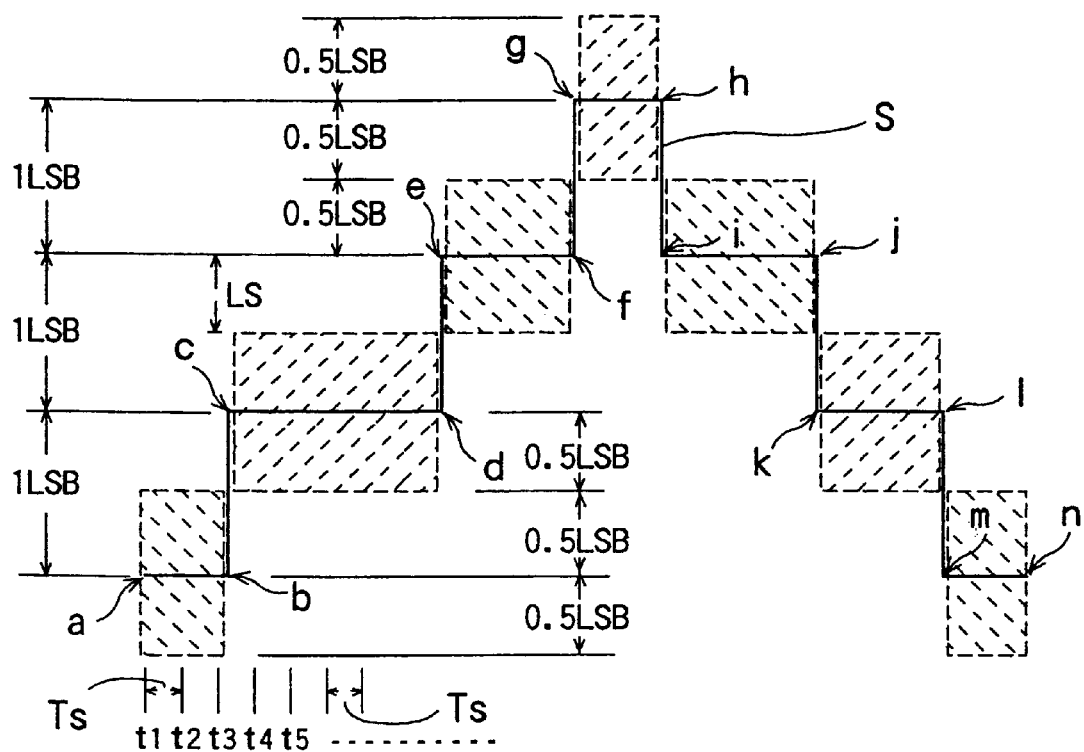
FIG. 1 is a diagram for assistance in explaining the error of digital signals obtained by D/A conversion of an analog signal.

Here, as described before with reference to FIG. 1, there is an error of less than ±0.5 LSB with respect to the resolution one LSB of $½^N$ between the waveform of the N-bit digital values shown in FIG. 9A and an original analog signal waveform from which the digital values of the N-bit coded data are obtained.

In this respect, the signal processor 3 to process signals for improving coded data resolution operates as follows to convert N-bit coded data into M-bit coded data (M>N) with errors as few as possible:

When the N-bit coded data which are the digital signals converted from the original analog signals in the resolution of $½^N$, detected first are the sequential transition points of the digital values of the N-bit coded data. The transition points are divided into transition point groups per sequential four points. The digital value transition pattern of each of the sequential groups is discriminated to which of sixteen reference patterns the transition pattern is classified. In accordance with one of the 16 patterns to which the transition pattern is classified, the linear interpolation to be applied to the period between the second and the third transition points of each transition point group is decided in relation to the linear interpolation already applied to the period between the first and the second transition points of each transition point group. Operations are conducted so that the linear interpolation decided per transition point group will be applied with digital signals in the resolution of $½^M$. Then, the linear interpolation is applied to the period of each transition group in accordance with the operations. Furthermore, linear interpolation is applied per period between two sequential transition points so that the area of a rectangle formed in order that digital value transition level corresponds to the resolution 1 LSB of $½^N$ and the figure formed by the rectangle and the lines indicated by the digital signals of the resolution of $½^M$ are almost equal to each other to obtain an (M–N) bit additional signals from the digital signals in the resolution of $½^M$. Further, an offset value is generated to make the step-like waveform of the interpolated digital signals in the resolution of $½^M$ shifted by one half the sampling period on the time axis. The (M–N) bit additional signals are modified by the offset value. Then, the modified (M–N) bit additional signals are sequentially attached to the least significant bit of the N-bit coded data to convert the N-bit coded data into the M-bit coded data (M>N).

As described above, by the signal processor 3, detected first are sequential digital value transition points of the N-bit coded data to be subjected to bit number conversion. Next, the digital value transition pattern of each transition point group of four transition points is discriminated to which of 16 reference patterns the transition pattern is classified.

This discrimination will be explained in detail with respect to FIGS. 9A and 9C.

The digital value transition of the four transition points "a", "b", "c" and "d" of the first transition point group are represented by [1] [1] [1] [1] where [1]([0]) indicates increase (decrease) in digital value. Next, the four transition points "b", "c", "d" and "e" of the second transition point group are represented by [1] [1] [1] [0], likewise, the points "c", "d", "e" and "f" of the third group by [1] [1] [0] [0], and the points "d", "e", "f" and "g" of the fourth group by [1] [0] [0] [0].

Each digital value transition corresponds to one of the 16 reference transition patterns 0000, 0001, 0010, 0011, 0100, 0101, 0110, 0111, 1000, 1001, 1010, 1011, 1100, 1101, 1110 and 1111. Linear interpolation is then decided in accordance with the 16 patterns.

Each digital value transition is discriminated to which of the 16 patterns the digital value transition is classified. And, the operation is conducted so that a predetermined linear interpolation is applied to the digital data in accordance with one of the 16 patterns to which the digital value transition is classified.

In other wards, the operation is conducted so that a predetermined linear interpolation to be applied to the period between the second and the third transition points of each transition point group is applied with the digital signals in the resolution of $½^M$ in relation to the linear interpolation already applied to the first and the second transition points of the transition point group. Next, linear interpolation is applied per period between two sequential transition points so that the area of a rectangle formed in order that digital value transition level corresponds to the resolution 1 LSB of $½^N$ and the figure formed by the rectangle ant the lines indicated by the digital signals of the resolution of $½^M$ are almost equal to each other to obtain an (M−N) bit additional signals from the digital signals in the resolution of $\frac{1}{2}^M$. Then, the (M−N) bit additional signals modified by the offset value described above are sequentially attached to the least significant bit of the N-bit coded data to convert the N-bit coded data into the M-bit coded data (M>N).

The linear interpolation to the period between the second and the third transition points of a transition point group to be applied in relation to the linear interpolation already applied to the first and the second transition points of the group in accordance with the sixteen reference patterns are shown in FIGS. 11 to 18 which will be described later in detail.

Figure 10:
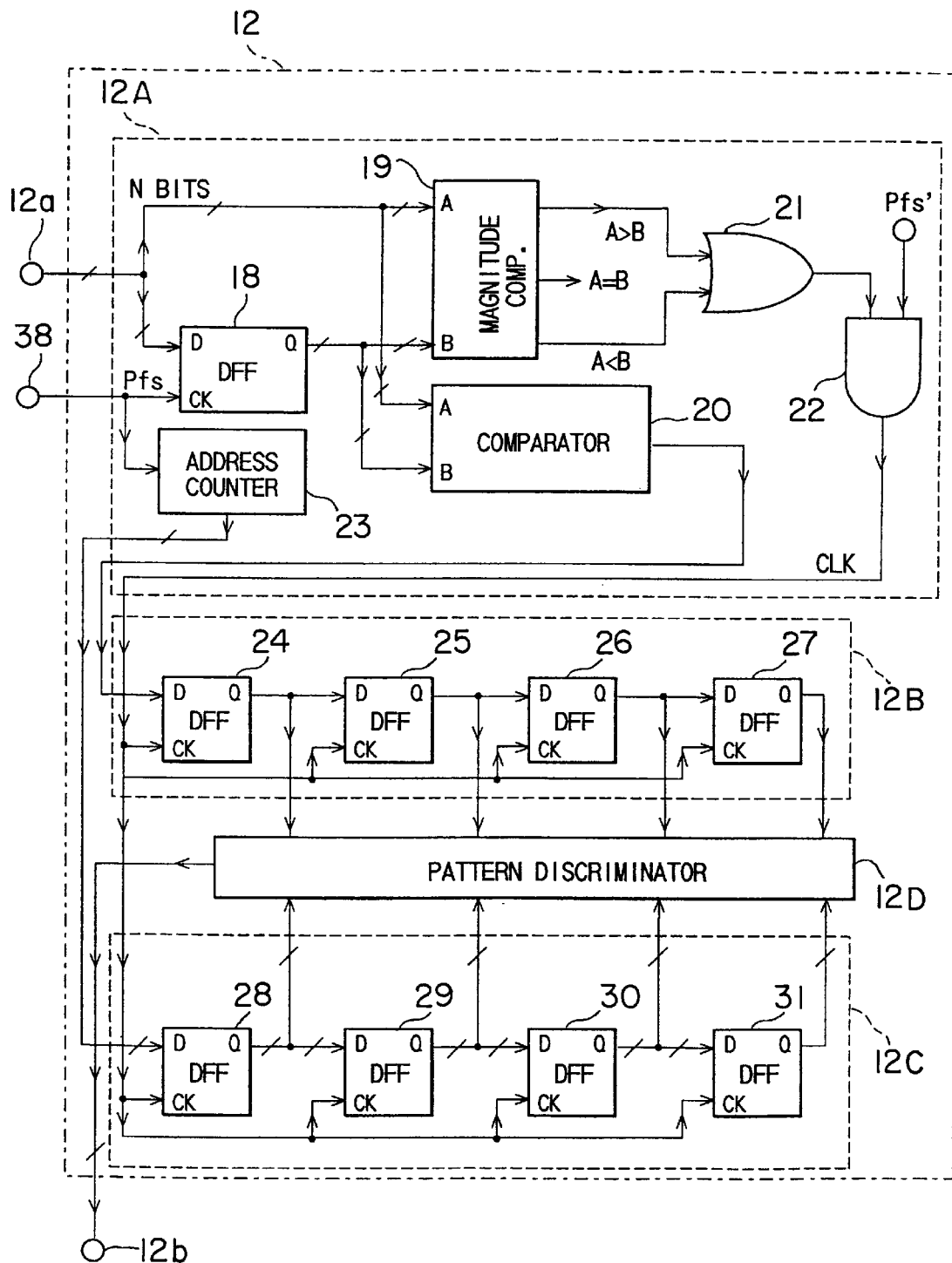
FIG. 10 is a block diagrams showing the discriminator of the signal processor according to the present invention.
Figures 13A, 13B:
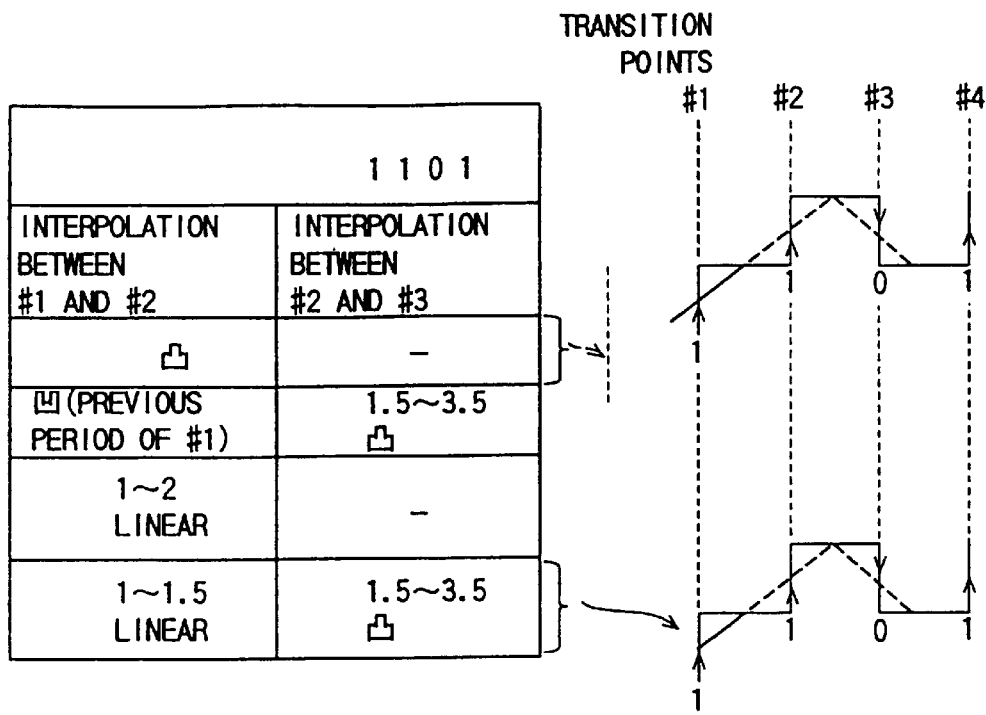
FIG. 13 shows a table and waveform diagrams for assistance in explaining the linear interpolation according to the present invention.
Figures 14A, 14B:
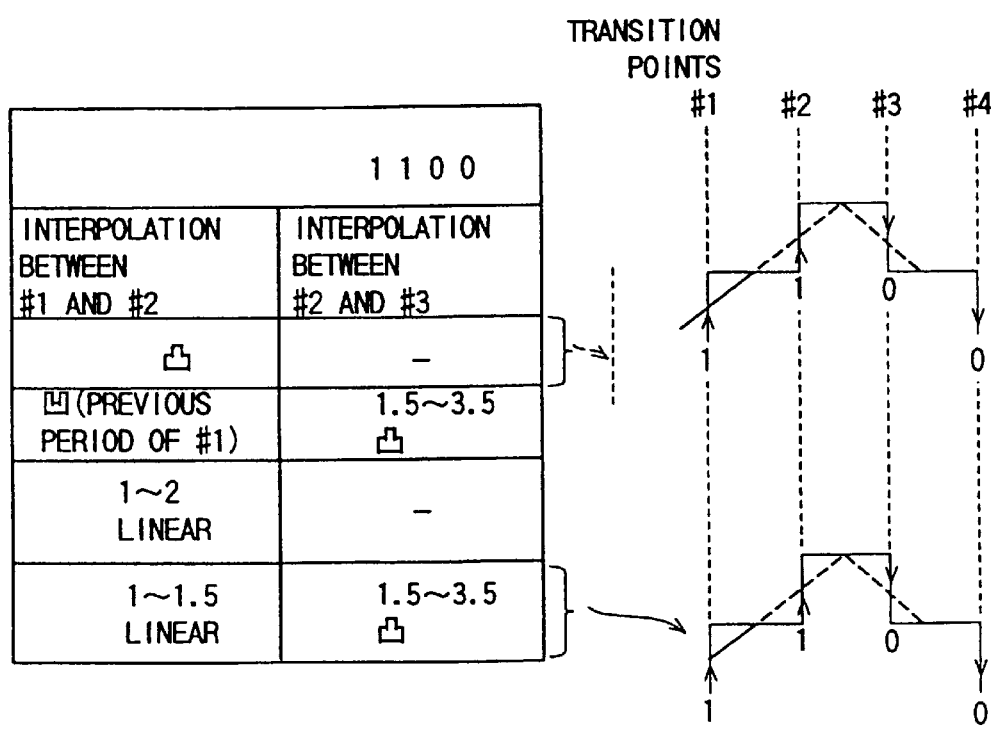
FIG. 14 shows a table and waveform diagrams for assistance in explaining the linear interpolation according to the present invention.
Figures 15A, 15B:
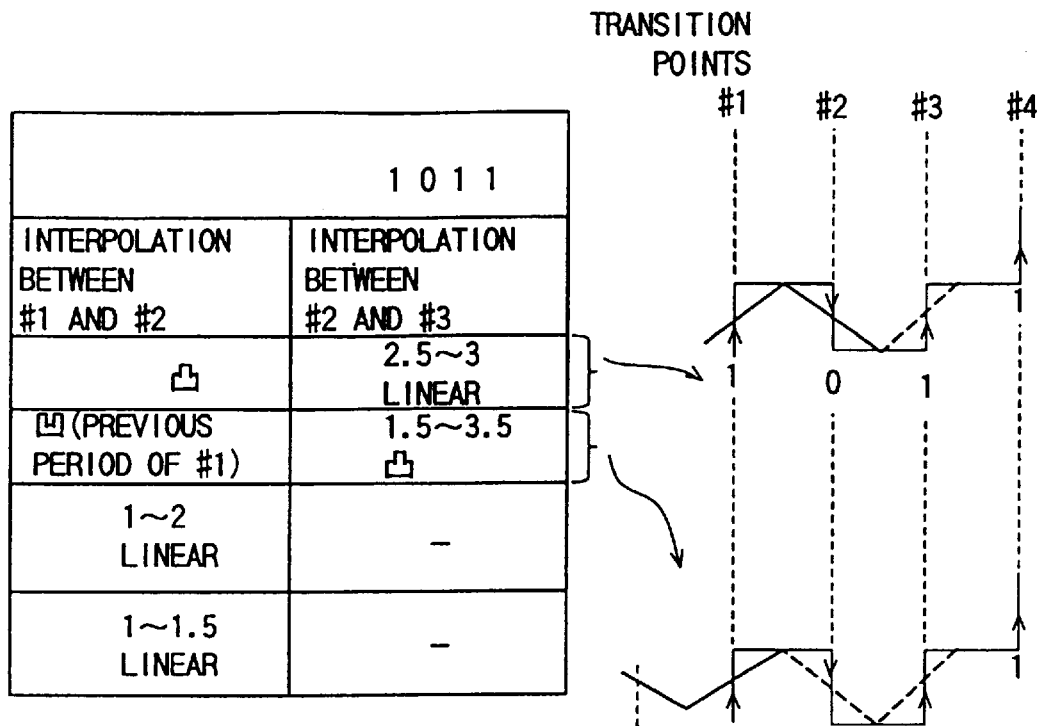
FIG. 15 shows a table and waveform diagrams for assistance in explaining the linear interpolation according to the present invention.
Figures 16A, 16B:
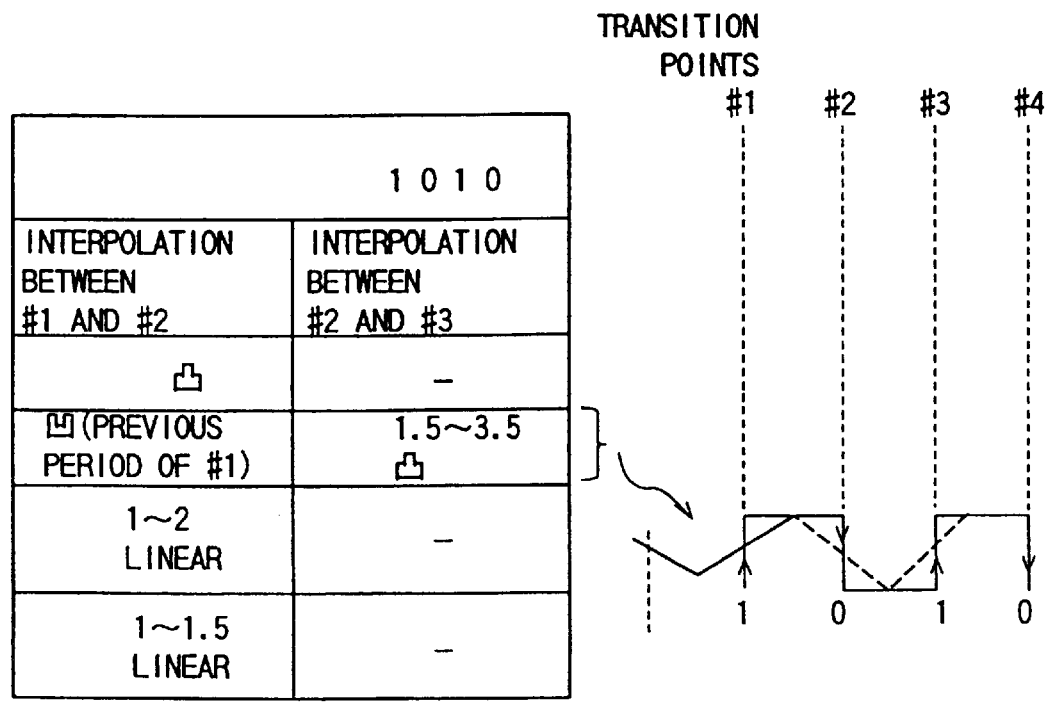
FIG. 16 shows a table and waveform diagrams for assistance in explaining the linear interpolation according to the present invention.
Figures 17A, 17B:
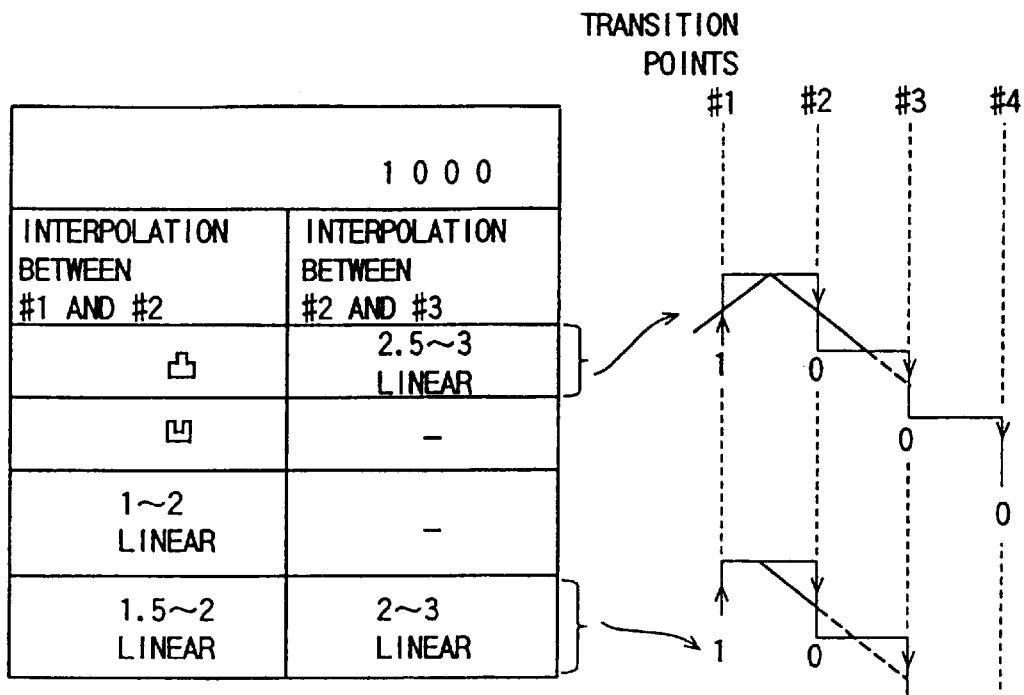
FIG. 17 shows a table and waveform diagrams for assistance in explaining the linear interpolation according to the present invention.
Figures 18A, 18B:
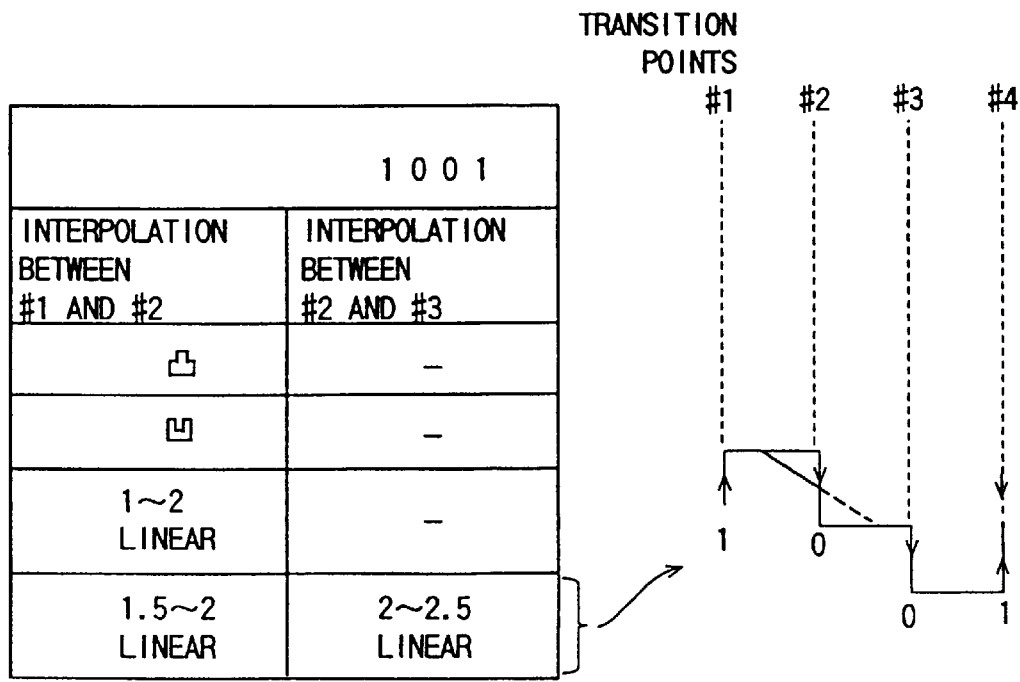
FIG. 18 shows a table and waveform diagrams for assistance in explaining the linear interpolation according to the present invention.

With reference to FIG. 10, the discriminator 12 of FIGS. 6 and 8 will be explained in further detail. In FIG. 10, the discriminator 12 is provided with an extractor 12A for extracting the transition points of the signal waveform, a pattern extractor 12B for extracting the transition point pattern of the signal waveform, an address generator 12C for detecting an address of the transition point of the signal waveform, and a pattern discriminator 12D for discriminating the transition pattern. The N-bit digital signals to be processed are supplied to the input terminal 12a (the same as the input terminal 12a shown in FIG. 6). The clock pulses Pfs are supplied to the input terminal 38. The clock pulses Pfs have a frequency the same as the sampling frequency used when the N-bit digital signals are generated. When the digital signals are audio digital signals, the frequency of the clock pulse signals Pfs is 88.2 KHz, for instance.

The digital signals supplied to the extractor 12A through the input terminal 12a are given to an A-input terminal of a magnitude comparator 19, a data terminal of a DFF 18, and an A-input terminal of a comparator 20. Further, the clock pulses Pfs are given to a clock terminal of the DFF 18 through the input terminal 38. The DFF 18 delays the digital signals, by one sampling period and outputs the delayed digital signals from a Q terminal thereof. The digital signals output by the DFF 18 are supplied to a B-input terminal of the magnitude comparator 19 and a B-input terminal of the comparator 20.

The magnitude comparator 19 compares the value of the N-bit digital data A supplied through the A-input terminal with the value of the N-bit digital data B supplied through the B-input terminal. When the value of the digital data A is larger than that of the digital data B, only the output terminal A>B is set to the high level. At this time, the other output terminals A<B and the terminal A=B are set to the low level. Further, when the value of the digital data A is equal to that of the digital data B, only the output terminal A=B is set to the high level. At this time, the other output terminals A>B and the terminal A<B are set to the low level. Further, when the value of the digital data B is larger than that of the digital data A, only the output terminal A<B is set to the high level. At this time, the other output terminals A>B and the terminal A=B are set to the low level.

The comparator 20 compares the value of the digital data A supplied through the A-input terminal with the value of the digital data B supplied through the B-input terminal being delayed by one sampling time. When the value of the digital data A is larger than the value of the digital data B, that is, when the transition points indicate an increase status in FIGS. 9A and 9B, a logical value [1] is generated, irrespective of the increase rate. Further, when the value of the digital data B is larger than the value of the digital data A, that is, when the transition points indicate a decrease status in FIGS. 9A and 9B, a logical value [0] is generated, irrespective of the decrease rate. The output of the comparator 20 is supplied to the data terminal of a DFF 24 of the pattern extractor 12B. The outputs of the terminals A>B and A<B of the magnitude comparator 19 are supplied to an OR circuit 21. The output of the OR circuit 21 is set to the high level when any one of the outputs of the output terminals A>B and A<B is set to the high level. The output signal of the OR circuit 21 is supplied to an AND circuit 22. Further, the signals Pfs' are supplied to the AND circuit 22 as a gate pulse. The gate pulses Pfs' are pulses having the same frequency as that of the clock pulses Pfs but 180-degrees out of phase from the clock pulses Pfs. Therefore, whenever the N-bit digital signal values vary, the AND circuit 22 outputs a clock pulse CLK at the timing of the gate pulse Pfs'. The clock pulses CLK output by the AND circuit 22 are supplied to clock terminals of DFFs 24 to 27 of the pattern extractor 12B and clock terminals of DFFs 28 to 31 of the address generator 12C.

The clock pulses Pfs are also given to an address counter 23 that outputs address signals (data). The address signals are supplied to a data terminal of the DFF 28 of the address generator 12C. Therefore, whenever the clock pulse CLK output by the AND circuit 22 is at the high level, the DFF 28 reads the address value at the transition point from the data terminal thereof. The address value read by the DFF 28 is shifted through the DFFs 29 to 31 in sequence, whenever the clock pulse CLK varies to the high level. The address values output through the DFFs 28 to 31 are given to the pattern discriminator 12D.

The DFFs 24 to 27 of the pattern extractor 12B shift the logical value output by the comparator 20 in sequence in accordance with the clock pulses CLK. Further, the DFFs 24 to 27 output a logical value [1] or [0] in correspondence to the transition in increase or decrease of the digital value of the digital signal on the time axis, to the Q outputs thereof. The -Logical value pattern obtained by these outputs is any one of the 16 types in all as 0000, 0001, 0010, 0011, 0100, 0101, 0110, 0111, 1000, 1001, 1010, 1011, 1100, 1101, 1110, and 1111. The outputs of the DFFs 24 to 27 are supplied to the pattern discriminator 12D.

The pattern discriminator 12D is provided with 16 match circuits (not shown) corresponding to the above-mentioned 16 patterns. These 16 match circuits in total correspond to the 16 numerical values obtained by combinations of four transition points developed in sequence on the time axis, as already explained. The four digit values represented by the combinations of the logical values at four transition points given in sequence from the Q terminals of the DFFs 24 to 27 of the pattern extractor 12B are discriminated by these 16 match circuits with respect to the transition patterns. The four digit value is 1111 in the case of four transition points "a" to "d" or 0001 in the case of four transition points "f" to "i" shown in FIG. 9C, for instance.

Whenever the transition points appear on the time axis in sequence, at least one of the 16 match circuits of the pattern discriminator 12D outputs a match signal. The pattern discriminator 12D supplies a signal indicative of the types of the predetermined transition pattern corresponding to the match circuit now outputting a match signal (e.g., a numeral value set for the match circuit which outputs the match signal) and the address data indicative of the four transition points to the additional signal generator 13 shown in FIGS. 6 and 8 through the output terminal 12b.

The additional signal generator 13 generates an additional signal so that a predetermined linear interpolation can be made at the interval between the second and third transition points, in accordance with the discriminated transition point pattern of the 16 patterns and in relation to the already executed linear interpolation at the interval between the first and second transition points of the transition point group of the first to third transition points.

When the N-bit digital signals are transformed into M-bit digital signals, the generated additional signals are (M–N)-bit digital signals.

The additional signals are such (M–N)-bit signals that a linear interpolation can be made for the waveform, as shown in FIG. 9C. In this waveform, the transition rates at the transition points of the N-bit digital signals are represented as one LSB. At the periods during which the linear interpolation is made, the additional signals are generated in such a way that the integral value of the waveform (shown in FIG. 9C) obtained by limiting the transition rates at the transition points of the N-bit digital signals down to one LSB can be equalized to the integral value of the waveform represented by the linearly-interpolated M-bit digital signals. The (M–N)-bit additional signals are the signals having amplitudes less than one LSB of the N-bit digital signals. The generated (M–N)-bit additional signals are added to the N-bit digital signals.

The additional signals can be generated easily by use of data indicative of the types of the transition patterns as the address signals and further by outputting data indicative of predetermined additional signals from a ROM table (not shown) provided in the additional signal generator 13, for instance.

FIGS. 11 to 18 show how to execute the linear interpolation in accordance with the transition patterns. The linear interpolation to be executed at the period between the second and third transition points in a transition point group is determined in relation to the linear interpolation already executed at the interval between the first and second transition points of that group. In each of these drawings, #1 to #4 represent four continuous transition points on the time axis. Further, the numeral arrangement, such as [1111], represents the transition of digital values at the four transition points of one transition point group developing in sequence on the time axis, by use of logical values [1] and [0], where [1] indicates an increase and [0] indicates an decrease.

The representation of convex and concave in the interpolation mode columns between #1 and #2 and between #2 and #3 represent that the interpolation mode is convex or concave (not linear) at the periods. Further, the numerals (e.g., 1 to 2 or 2.5 to 3, etc.) in the interpolation mode columns between #1 and #2 and between #2 and #3 represent that the linear interpolation is executed. Further, the representation of "-" in the interpolation mode column between #2 and #3 represents that the linear interpolation is not executed between #2 and #3. Further, when the interpolation is executed at the period including between #2 and #3, the interpolation is shown by a dashed line. Further, when the interpolation is executed at the period including between #1 and #2, the interpolation is shown by a solid line.

In each of FIGS. 11 to 18, only eight types of patterns (1111, 1110, 1101, 1100, 1011, 1010, 1000, and 1001) are shown as the combinations of the digital value transitions (an increase or decrease of the digital values) at the four transition points #1, #2, #3 and #4. However, the 16 types of patterns already explained can be obtained by combining the above-mentioned eight patterns and other eight patterns (in which [1] and [0] are reversed in the numerical arrangement in the above-mentioned eight patterns), in practice it is possible to cope with the 16 types of patterns by using only eight types of pattern data, as shown in FIGS. 11 to 18.

On the basis of the data indicative of the types of the transition point patterns, the additional signal generator 13 of FIG. 8 decides the linear interpolation mode as shown in FIGS. 11 to 18, for instance, in correspondence to the linear interpolation already-executed at the interval between the first and second digital value transition points of the present transition point group composed of four transition points or in correspondence to the linear interpolation already-executed at the interval between the second and third digital value transition points of the preceding transition point group composed of four transition points. The additional signal generator 13 executes the calculations so that the (M–N)-bit additional signals corresponding to the linear interpolation decided as described above can be generated.

In FIG. 8, the transition point address data are supplied from the discriminator 12 to the additional signal generator 13, together with the data indicative of the types of the transition patterns. Further, the transition point interval data required for calculation to generate the additional signals can be obtained by calculating the mutual differences between the four transition point address data.

Figure 19A:
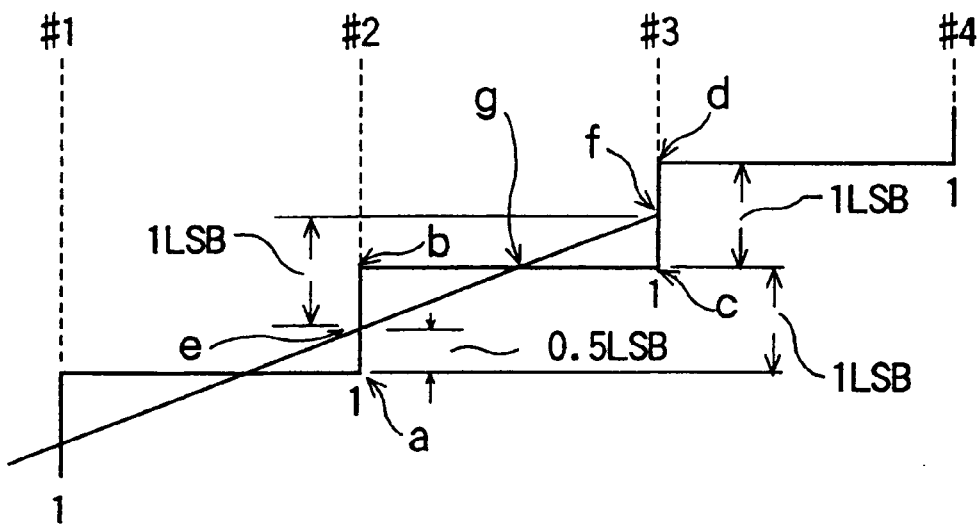
FIGS. 19A to 19D are waveform diagrams for assistance in explaining the linear interpolation according to the present invention.
Figure 19B:
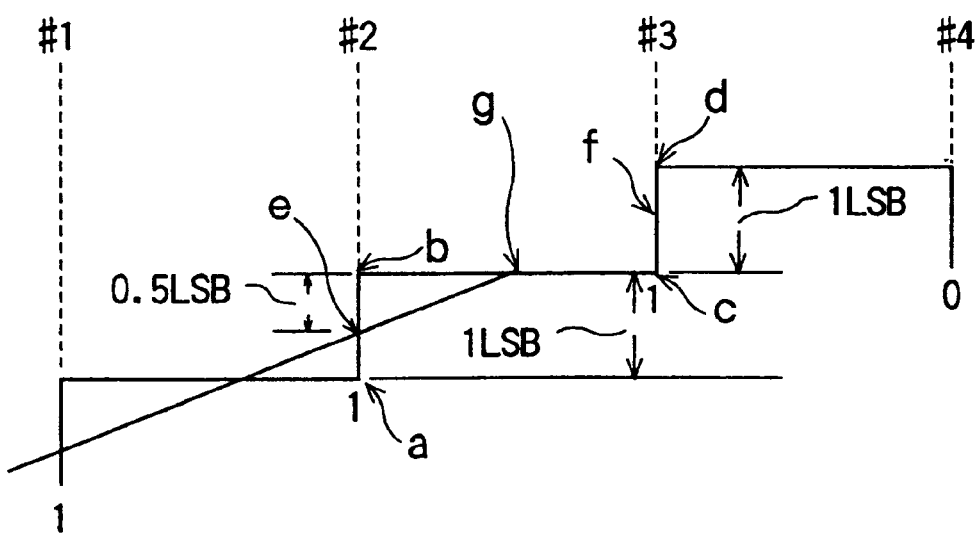
Figure 19:
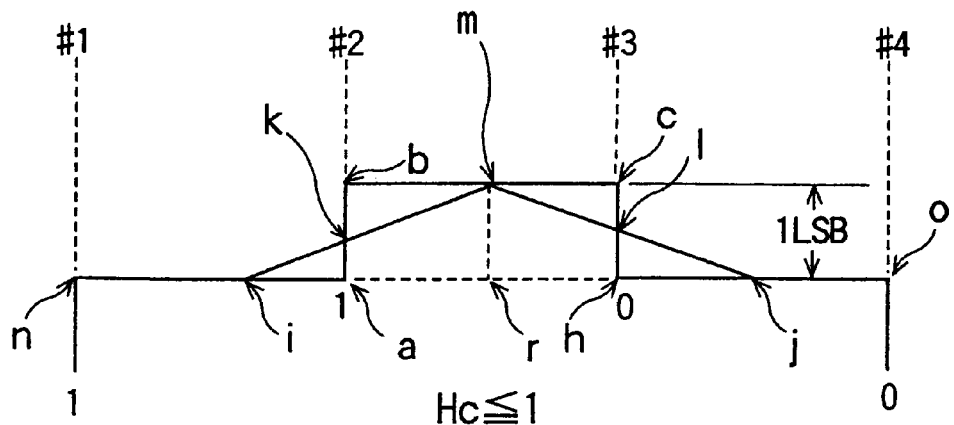
Figure 19:
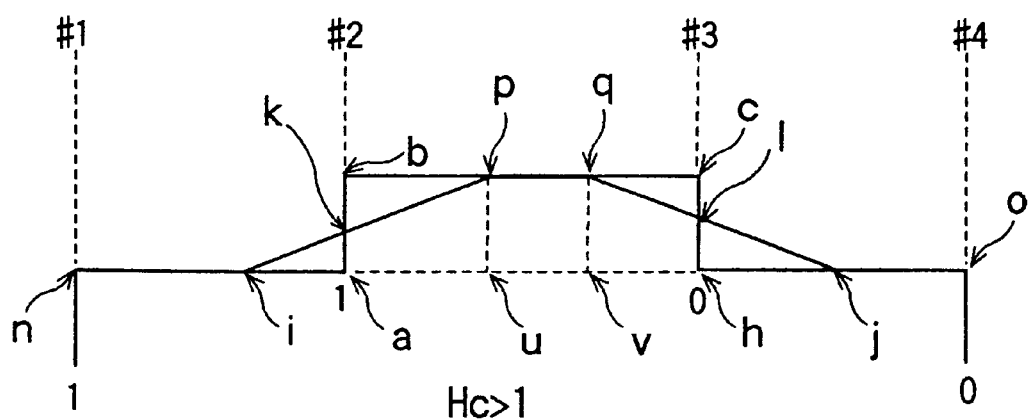

FIGS. 19A to 19D are diagrams for assistance in explaining how to decide the interpolation line to be obtained at the interval between the second and third digital value transition points of one transition point group. FIGS. 19A to 19D show four typical transition patterns formed by four transition points. In more detail, FIG. 19A shows an example of the transition pattern in which digital values at the four sequential transition points increase monotonously. FIG. 19B shows another example of the transition pattern in which digital values at the four sequential transition points first increase monotonously and then decrease. FIG. 19C shows another example of the transition pattern in which digital values at the four sequential transition points first increase and at once decrease (convex). FIG. 19D shows the other example of the transition pattern in which digital values at the four sequential transition points first increase, keep a constant level, and then decrease.

In FIGS. 19A to 19D, the linear interpolation to be executed for each transition pattern is shown by an oblique solid lines in the drawings. Further, in the drawings, #1, #2, #3 and #4 represent the first to fourth transition points of the four continuous digital values on the time axis, respectively. Further, an increase in digital value at a transition point is represented by the logical value [1] and a decrease of the digital value at a transition point is represented by the logical value [0]. Further, the periods between "a" and "b", between "c" and "d" and between "c" and "h" correspond to one LSB or $½^N$ resolution (resolving power).

First, in FIG. 19A, the linear interpolation between the second transition point #2 and the third transition point #3 can be obtained by an oblique line e→g→f (e→f) obtained by connecting a midpoint "e" between "a" and "b" at the second transition point #2 with a midpoint "f" between "c" and "d" at the third transition point #3. Here, the height difference between the two midpoints "e" and "f" is equal to one LSB of the $½^N$ resolution. The gradient between the interpolation line e→f can be obtained by calculating (L/bc), where bc denotes the distance between the transition points #2 and #3 and L denotes the $½^N$ resolution or one LSB. Further, the distance bc can be obtained by a difference in address value between the second and third transition points #2 and #3.

Secondly, in FIG. 19B, the linear interpolation between the second and third transition points #2 and #3 can be obtained by an oblique line e→g. This oblique line is a part of the line obtained by connecting a midpoint "e" between "a" and "b" at the second transition point #2 with a midpoint "f" between "c" and "d" at the third transition point #3. The gradient between the interpolation line e→g can be obtained in the same way as with the case of the interpolation line between e and f shown in FIG. 19A.

Successively, in the case of the transition pattern as shown in FIG. 19C, a midpoint "i" between the transition points #1 and #2 and a midpoint "j" between the transition points #3 and #4 are both determined. Then, two lines im and mj are obtained in such a way that the rectangular area abch becomes equal to the triangular area imj having a base line ij. Here, the height of the formed triangular imj is denoted by Hc.

Since the area of the rectangle abch is 1×ah, and the area of the triangle imj is (ij×Hc)/2, Hc can be obtained as $$1 \times ah = (ij \times Hc)/2$$

$$Hc = 2 \times ah/ij$$

Since the point "i" is a midpoint between the transition points #1 and #2, and further since the point "j" is a midpoint between the transition points #3 and #4, the value Hc can be obtained easily on the basis of the address values of the transition points #1 to #4.

Here, two cases of Hc value can be considered as (1) Hc is equal to or smaller than 1 and (2) Hc is larger than 1.

In the case where Hc is equal to or smaller than 1, the position of the point "m" on the time axis, that is, the position of the point r is set to a point at which the line ah is divided by a ratio of the interval length between the transition points #1 and #2 and the interval length between the transition points #3 and #4. In other words, the period length (the number of sampling period Ts) of the line ar and the period length of the line rh can be obtained as $$ar = ah \times na/(na+ho)$$

$$rh = ah - ar$$

Therefore, the gradient of the line im and the gradient of the line mj are as follows:

Gradient of line $im = Hc/ir$

Gradient of line $mj = Hc/rj$

Further, the period lengths of the lines ir and rj can be obtained as $$ir = (na/2) + ar$$

$$rj = (ho/2) + rh$$

Secondly, when Hc is larger than 1, the linear interpolation is executed as shown in FIG. 19D. In FIG. 19D, the gradient of the line ip and the gradient of the line qj can be obtained as follows:

Gradient of line $ip = 1/iu$

Gradient of line $qj = 1/vj$

Further, the gradient of the line pq is 0.

Here, however, the points "u" and "v" shown in FIG. 19D are determined by the points p and q in such a way that the line segment ia is equal to the line segment au and further the line segment vh is equal to the line segment hj.

Further, the period lengths of the lines iu and vj in the above formulae can be obtained as follows:

$$iu = 2 \times (na/2) = na$$

$$vj = 2 \times (ho/2) = ho$$

$$uv = ah - (na/2) - (ho/2)$$

As explained above, the transition patterns expressed by the four sequential transition points #1, #2, #3 and #4 can be limited to only 16 types in total of the eight types as shown in FIGS. 11 to 18 and the other eight types whose transition patterns are opposite to those shown in FIGS. 11 to 18. The linear interpolation pattern to be executed at the interval between the second and third transition points #2 and #3 (of the four transition points #1, #2, #3 and #4) has four types for each of 16 types of the transition patterns, as shown in FIGS. 11 to 18 according to the linear interpolation already executed at the interval between the first and second transition points #1 and #2. In other words, although there exits 64 (16×4) types of linear interpolation patterns in total, however, the additional signal generator 13 of FIG. 8 can generate linear interpolation data easily, for each transition point group composed of four transition points, by the above-mentioned calculations, as explained above with reference to FIGS. 19A to 19D.

The additional signal generator 13 shown in FIGS. 6 and 8 is provided with a control unit with RAM, ROM and CPU and an arithmetic unit for executing the operation so that a predetermined linear interpolation is applied to the period between the second and the third transition points of each transition point group composed of the four transition points #1, #2, #3 and #4. Further, the generator 13 executes the operation in order that linear interpolation with the resolution of $\frac{1}{2}^M$ is applied to the period between the second and the third transition points of each transition point group in accordance with one of the 16 digital value transition patterns generated for the transition points #1, #2, #3 and #4.

The linear interpolation data obtained by the operation described above by the additional signal generator 13 are sequentially stored in the memory thereof. The stored data are such that linear interpolation with the resolution of $\frac{1}{2}^M$ is applied to the waveform, such as, shown in FIG. 9C in which the digital data increases or decreases at the transition points with the resolution of $\frac{1}{2}^M$ in such a manner as described with respect to FIGS. 11 to 18.

In FIG. 6, the M-bit linear interpolation data stored in the memory of the generator 13 are sequentially read out. Then, data of (M−N) bits from the most significant bit (MSB) of the M-bit Linear interpolation data are extracted and supplied to the adder 15 and the fixed contact point "a" of the switch 17. Here, FIG. 9C shows that the transition of digital data at the transition points increases or decreases with the resolution 1 LSB of $\frac{1}{2}^N$ no matter how the digital data transition is large at the transition points as shown in FIG. 9A.

Figure 2A:
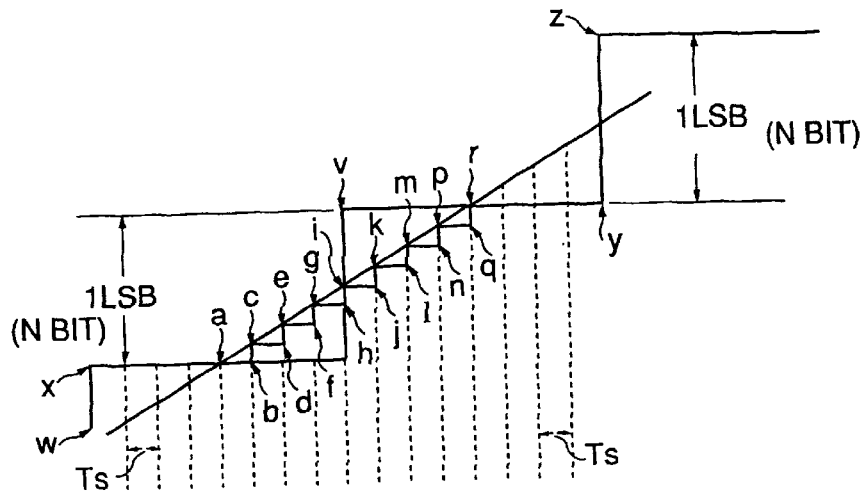
FIGS. 2A, 2B and 2C are waveform diagrams for assistance in explaining the operation of the conventional apparatus.

The M-bit linear interpolation data to be stored in the memory of the additional signal generator 13 are, for example, digital values corresponding to the points "a", "c", "e", "g", "i", "k" "m", "p" and "r" on the straight line ar, data on the sampling points and slope data of the straight line ar as shown in FIG. 2A. And, (M−N) bit data from MSB of the M-bit linear interpolation data is extracted and output from the generator 13.

As described above, in the signal processor 3 to process signals for improving coded data resolution, the offset value generated by the offset value generator 14 is added to the linear interpolation data with the resolution of $\frac{1}{2}^M$ (M>N) obtained by the additional (M−N) bit generator 13. Accordingly, the linear interpolation data at the sampling points can be converted, such as, from the status as shown in FIGS. 2A to 2C to the status as shown in 20A to 20C.

Figure 2B:
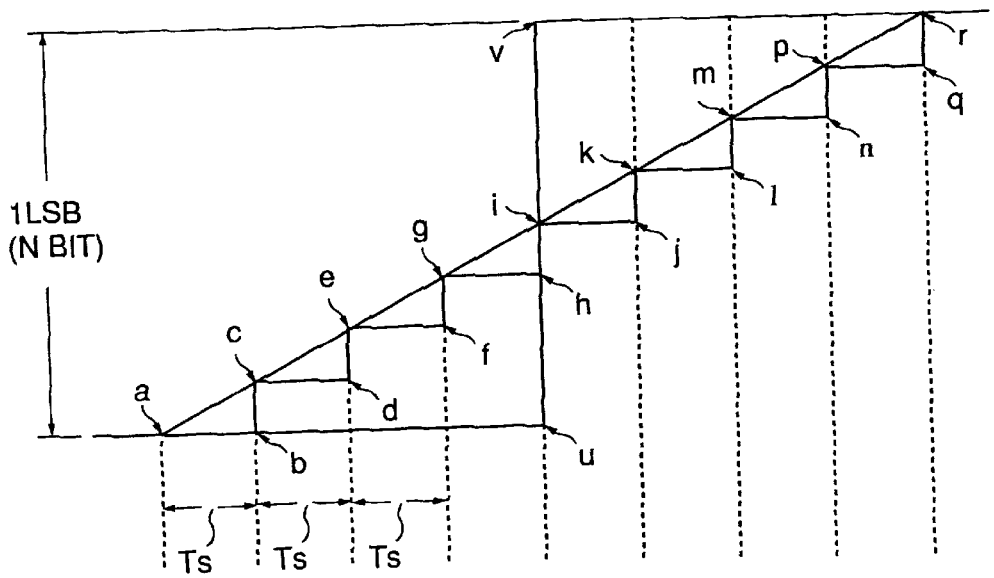
Figure 2C:
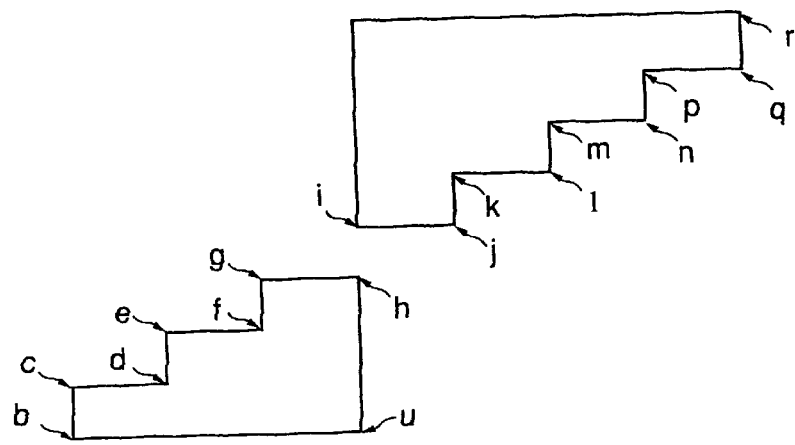

As described above, the memory of the additional (M−N) bit generator 13 stores the linear interpolation data with the resolution of $\frac{1}{2}^M$ (M>N), such as, digital values corresponding to the points "a", "c", "e", "g", "i", "k", "m", "p" and "r", etc., on the straight line ar shown in FIGS. 2A and 2B, and the slope data of the line ar. Then, the offset value generator 14 uses those data to generate an offset value so that the waveform shown in FIG. 2A of the linearly interpolated digital signals in the resolution of $\frac{1}{2}^M$ generated by the additional (M−N) bit generator 13 is shifted by the one half the sampling frequency to obtain the step-like waveform digital data as shown in FIG. 20A.

Figure 20A:
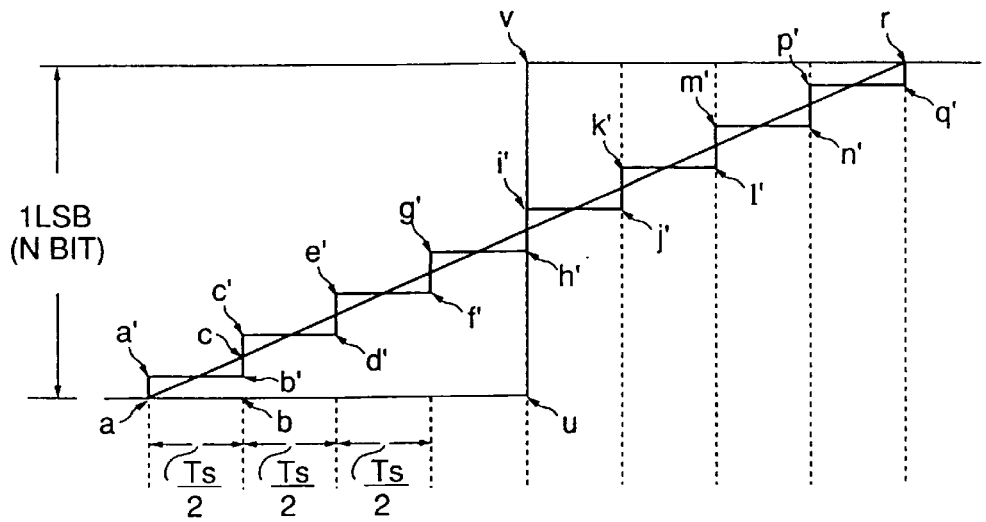
FIGS. 20A to 20C are waveform diagrams for assistance in explaining the linear interpolation according to the present invention.
Figure 20B:
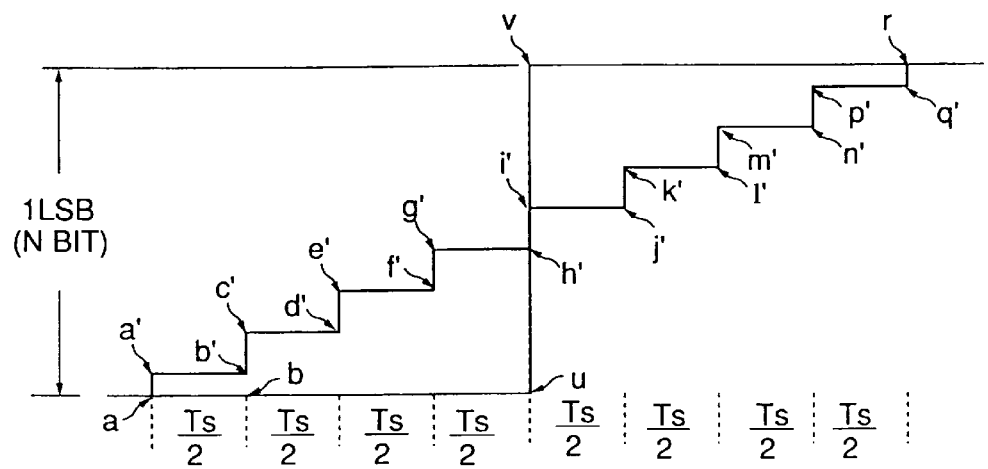

The straight line ar shown in FIG. 20A corresponds to the straight line ar shown in FIG. 2A. The points where the straight lien ar and vertical lines at the sampling points intersect as shown in FIG. 20A correspond to the points "a", "c", "e", "g", "i", "k", "m" and "p" shown in FIG. 2A. Further, the digital values represented by the points "a'", "c'", "e'", "g'", "k'", "i'", "m'" and "p'" shown in FIG. 20A are obtained by applying specific offset values (for example, a→a', c→c', . . . ) to the digital values represented by the points "a", "c", "e", "g", "i", "k", "m" and "p" shown in FIG. 2A.

Here, the offset values (for example, a→a', c→c', . . . ) generated by the offset value generator 14 shown in FIG. 6 will be described in detail.

Each offset value is represented as a difference between the height of a first point where the vertical line provided in the middle of two succeeding sampling points and the line ar intersect and the height of a second point where the vertical line provided at the sampling point just before the first point and the line ar intersect.

Figure 20C:
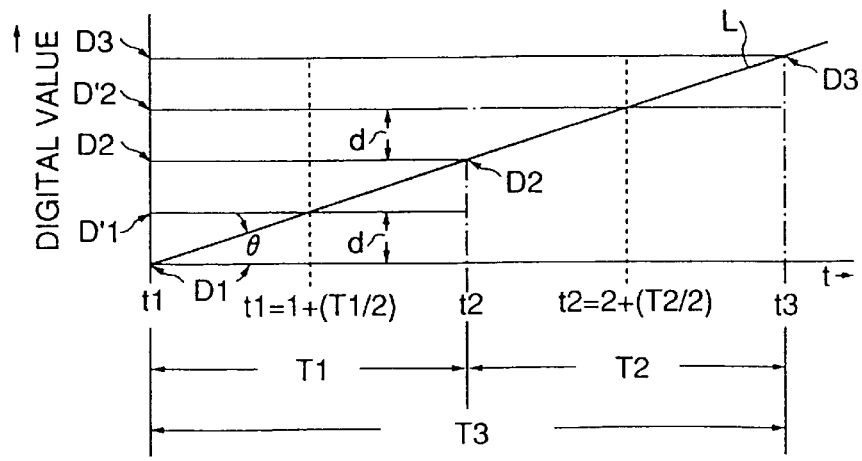

FIG. 20C explains how a specific offset value is generated by the offset value generator 14 using the digital values corresponding to the points "a", "c", "e", "g", "i", "k", "m", "p" and "r", etc., on the straight line ar, sampling positional data and the slope data of the line ar shown in FIGS. 2A.

In FIG. 20C, the time points t1, t2, t3, . . . represent sequential sampling points. And, the periods T1 and T2 are the sampling period Ts. The signs D1, D2 and D3 denote digital values at the sampling points at the time points t1, t2 and t3, respectively. Further, the digital values D1, D2 and D3 are digital values (corresponding to the points "a", "c", "e", "g", "i", "k", "m", "p" and "r" on the straight line ar described with reference to FIG. 2A) at sequential sampling points stored in the memory which stores the linear interpolation data with the resolution of $\frac{1}{2}^M$ obtained by the additional signal generator 13.

In FIG. 20C, the straight line L connecting the points D1, D2 and D3 corresponding to the straight line ar shown in FIGS. 2A and 20A. Further, digital values D1' and D2' at the sampling points at the time t1 and t2, respectively are obtained by adding a specific offset value "d" to digital values D1 and D2 at the sampling points at the time t1 and t2, respectively.

The offset value "d" is obtained by the offset value generator 14 shown in FIG. 6 by the following ways:
(1) The offset value "d" is obtained as d=(Ts/4)cotθ, where the angel θ is obtained by the slope of the straight line L indicated by the linearly interpolated digital signals in the resolution $\frac{1}{2}^M$, and Ts/4 (T1/2, T2/2) is the one half of the sampling period.
(2) The offset value "d" is obtained as d=(D2−D1)/2 which is one half of the difference between digital values of two succeeding digital signals.
(3) The offset value "d" is obtained as d=(N-bit 1 LSB)/2n with respect to the digital signals in the resolution $\frac{1}{2}^M$ linearly interpolated in the interval nTs (n: a natural number, Ts: sampling period).

In FIG. 6, the offset Value "d" generated by the offset generator 14 is supplied to the adder 15. The adder 15 adds the offset value "d" and (M−N) bit data with the resolution $\frac{1}{2}^M$ generated by the additional signal generator 13 and supplies an added value (output data) to the fixed contact point "b" of the switch 17 and also to the N-bit 1 LSB overflow detector 16. The detector 16 generates a switching control signal to force the movable contact "v" that has touched the fixed contact point "b" to touch the fixed contact point "a" when the digital data output from the adder 15 exceeds the N-bit 1 LSB.

More in detail, when the digital data output from the adder 15 does not exceed the N-bit 1 LSB, the output data of the adder 15 is supplied to the adder 11 via fixed and movable contact points "b" and "v" of the switch 17. On the other hand, when the digital data output from the adder 15 exceeds the N-bit 1 LSB, only the (M−N) bit data with the resolution of $\frac{1}{2}^M$ output from the (M−N) additional bit generator 13 is supplied to the adder 11 via fixed and movable contact points "a" and "v" of the switch 17.

The adder 11 adds the (M−N)-bit additional coded data to the N-bit coded data supplied from the delay unit 10 so that the (M−N)-bit additional coded data follows the least significant bit of the N-bit coded data to obtain the M-bit code data as shown in FIG. 20A. The M-bit coded data is much better in signal quality than the M-bit code data shown in FIG. 2A generated by the conventional signal processing apparatus. This is understandable when comparing the areas of the polygon formed of a→a'→b'→c'→d'→e'→f'→g'→h'→u and the polygon formed of r→v→i'→j'→k'→l'→m'→n'→p'→q' shown in FIG. 20B, and the areas of the polygon formed of b→c→d→e→f→g→h→u and the polygon formed of r→v→i→j→k→l→m→n→p→q shown in FIG. 2C.

Described next is the case where an average value of the M-bit linear interpolation data read from the memory of the additional signal generator 13 is calculated over a plurality of sampling periods to apply rounding to the M-bit linear interpolation data, the (M−N) bit data from the MSB of the M-bit interpolation data applied with the rounding is extracted and is used as (M−N) bit interpolation data.

Figure 21:
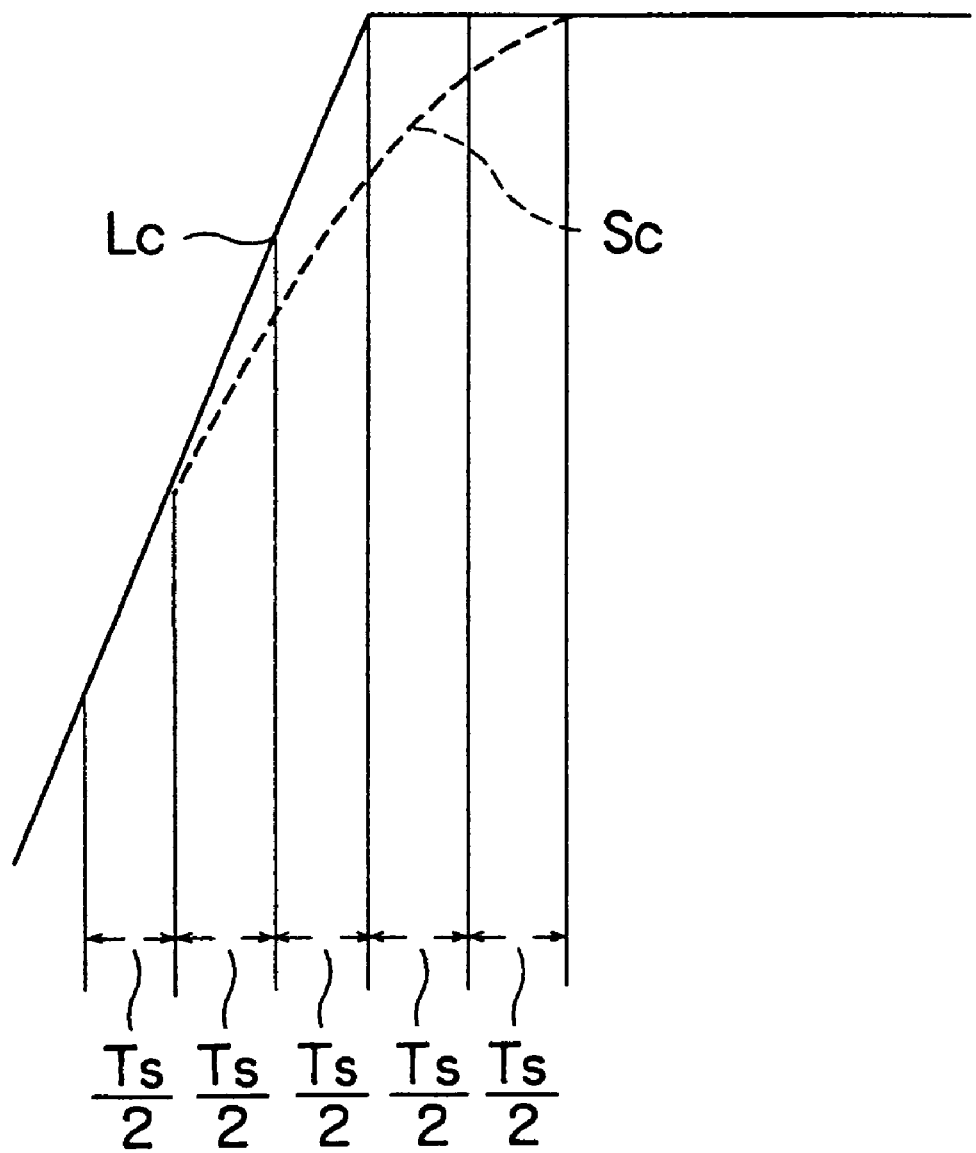
FIG. 21 is a waveform diagram for assistance in explaining the linear interpolation according to the present invention.

Here, the M-bit linear interpolation data per sampling period sequentially read from the memory are denoted as D1, D2, D3, D4, D5, D6, D7, . . . Each M-bit linear interpolation data is applied with rounding by calculating the average of the linear interpolation data per three sampling periods, that is, D2 is (D1+D2+D3)/3, D3 is (D2+D3+D4)/3, D4 is (D3+D4+D5)/3, D5 is (D4+D5+D6)/3. Then, specific (M−N) bit data is extracted so that linear interpolation is converted into nonlinear interpolation as shown in FIG. 21. In FIG. 21, the average of the linear interpolation data (digital data of slope or digital data for obtaining the digital data of slope) per sequential four sampling periods is used as the linear interpolation data at sequential sampling periods. This method obtains the linear interpolation shown as curve Sc from the original linear interpolation shown as straight line Lc.

When applying rounding, it is preferable to vary the number of sampling periods used for obtaining average corresponding to slope of the straight line for interpolation. In detail, when slope of the straight line for interpolation is small, the number of sampling periods used for obtaining average is increased. On the other hand, when slope of the straight line for interpolation is large, the number of sampling periods used for obtaining average is decreased. Further, when the direction of the slope of the straight line for interpolation is changed (convex and concave portions), the number of sampling periods used for obtaining average is increased.

When the number of sampling periods for obtaining average is varied corresponding to the slope of the straight line for interpolation, on the portion where the direction of the slope of the straight line for interpolation is changed (convex and concave portions), the area of the portion surrounded by the straight line for interpolation is sometimes smaller than the area of the rectangle on the convex and concave portions surrounded by the straight line of 1 LSB with the resolution $\frac{1}{2^N}$. In this case, it is preferable to conduct the linear interpolation under the condition that height Hc described before with reference to FIGS. 19C and 19D is made higher. Further, it is preferable, when rounding described above is applied to the linear interpolation, to make the area of the portion surrounded by the straight line for interpolation and the area of rectangle of the convex and concave portions surrounded by the straight line of 1 LSB with the resolution $\frac{1}{2^N}$ equal to each other.

In FIGS. 3A and 3B, the N-bit coded data of sampling period Ts to be subjected to signal processing are input to the cyclic data generator 2 to be cyclic data in which two N-bit coded data of sampling period Ts/2 appear succeedingly on the time axis. The cyclic data are then supplied to the signal processor 3 to be cyclic data in which two M-bit coded data of sampling period Ts/2 appear succeedingly on the time axis.

Figure 22:
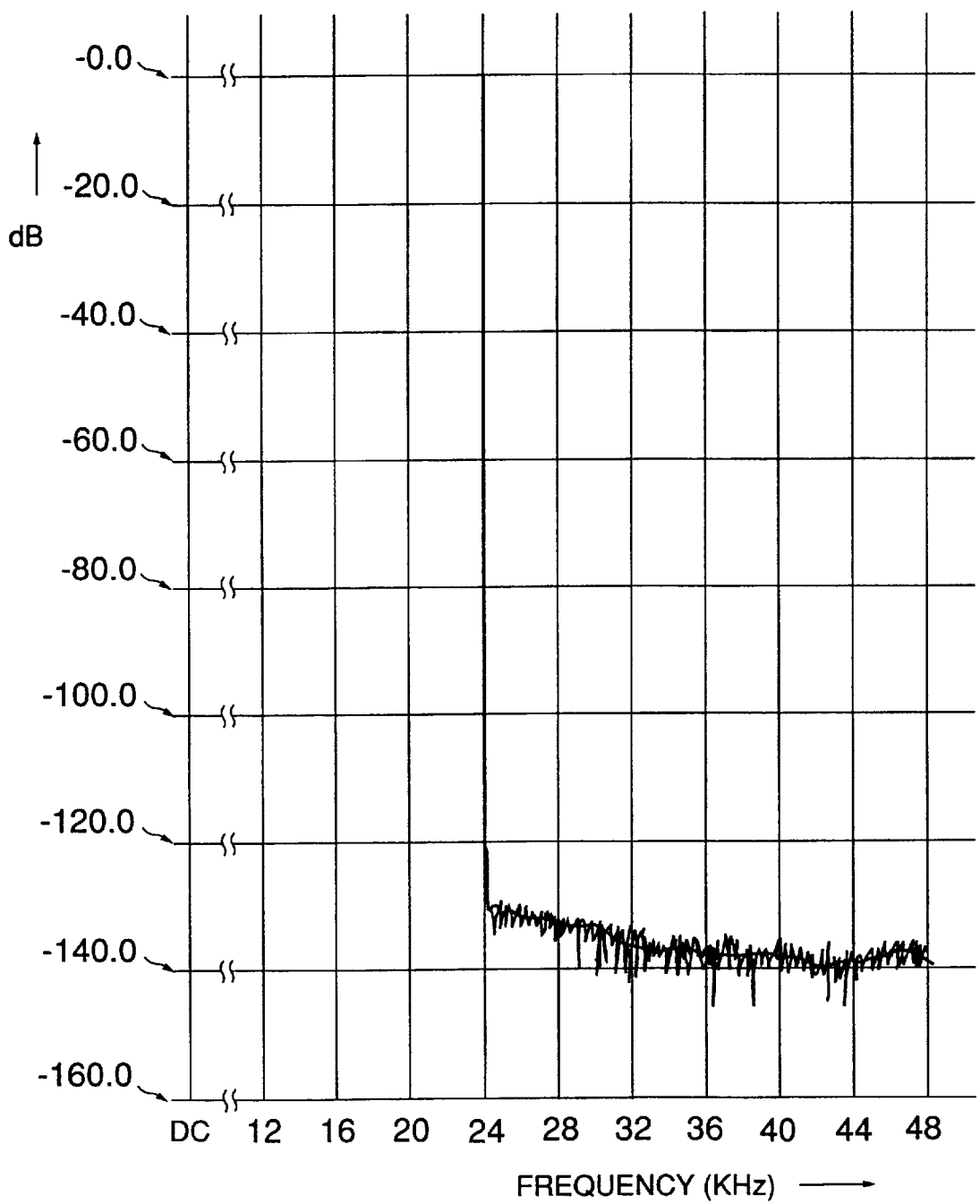
FIG. 22 shows the frequency characteristics of the digital low-pass filter of the signal processing apparatus according to the present invention.

The cyclic data output from the signal processor 3 are supplied to the low-pass filter 4. Employed as the low-pass filter 4 is a filter with the Nyquist frequency fs/4 as the cut-off frequency determined with respect to the sampling frequency fs/2 corresponding to the sampling period Ts of the N-bit coded data to be subjected to signal processing. FIG. 22 shows an example of band-pass characteristics of a digital low-pass filter with the cut-off frequency 24 KHz.

In FIG. 3A, the cyclic data in which two M-bit coded data of sampling period Ts/2 appear succeedingly on the time axis are filtered by the low-pass filter 4 and output via output terminal 6. When a low-pass filter for outputting M-bit coded data of sampling period Ts by decimating M-bit coded data of sampling period Ts/2 is employed as the low-pass filter 4, the filter 4 outputs the M-bit coded data of sampling period Ts to the output terminal.

On the other hand, in FIG. 3B, a data decimeter 5 outputs cyclic data in which two M-bit coded data of sampling period Ts/2 output from the low-pass filter 4 appear succeedingly on the time axis. The cyclic data from the data decimeter 5 is output via output terminal 6.

Employed as the data decimeter 5 are, for example, a decimation filter including a FIR digital filter or a switching circuit. The data decimeter 5 outputs the M-bit coded data of sampling period Ts to the output terminal 6.

In the embodiments as describe above, the output M-bit coded data is (1) the cyclic data of the sampling period Ts/2 which is one half the sampling period Ts of the N-bit coded data to be subjected to signal processing according to the invention or (2) the M-bit coded data of the sampling period Ts.

In case of (1), the invention can be applied to signal processing of coded data recorded on a digital audio tape (DAT) by a recording and reproducing apparatus for a digital video disc (DVD). Further, In case of (2), the invention can be applied to signal processing of coded data recorded on a compact disc by a recording and reproducing apparatus for a compact disc.

As described above, according to the present invention, compared to the conventional way of bit expansion, it is easy to reproduce audio and video signals in high resolution and quality. Further, interpolation can be conducted effectively according to the invention to digital value transition to which interpolation for increase in bit number cannot be conducted by the conventional apparatus. Therefore, according to the present invention, it is easy to obtain M-bit digital signals with high quality compared to the digital signals obtained by the conventional apparatus.

Next, the third and the fourth embodiments of the signal processing apparatus according to the present invention will be described with respect to FIGS. 23A and 23B, respectively.

In FIGS. 23A and 23B, N-bit coded data of sampling period Ts is supplied to an oversampling filter 200 via input terminal 100. The filter 200 executes double oversampling.

The sampling operation of the oversampling filter 200 will be described in detail with respect to FIGS. 7A and 7B which have been used for describing the signal processor 3 to process signals for improving coded data resolution shown in FIGS. 3A and 3B in the first and the second embodiments, respectively.

For the third and this fourth embodiments, FIG. 7A illustrates the N-bit coded data of sampling period Ts supplied to the oversampling filter 200, and FIG. 7B, N-bit coded data of sampling period Ts/2 processed by double oversampling by the oversampling filter 200.

Further, for the third and the fourth embodiments, FIG. 7A illustrates the situation where the digital values of the N-bit coded data to be subjected to signal processing vary by 1 LSB per one sampling period.

In detail, the step-like waveform a→b→c→d→ . . . →n shown in FIGS. 7A and 7B Illustrates the situation where the digital values of the N-bit code data of sampling period Ts supplied to the oversampling filter 200 vary per time Ts.

Further, in FIGS. 7A and 7B, the positions "b", "d", "f", "h", "i", "k" and "m", etc., indicate the magnitude of the digital values. In this respect, in FIG. 24 which will be referred to later, signs D1 and D1$a$ denote the digital value at the position "b" shown in FIGS. 7A and 7B, likewise, D2 and D2$a$ the position "d", and D3 and D3$a$ the position "f".

In FIG. 7B, the positions "b'", "d'", "f'", "h'" . . . →"1'" denote the magnitude of the digital values output from the oversampling filter 200 at the middle positions of the positions a→b→c→d→f→ . . . . In actual application, height of the positions, such as, the position "b'" may not be the one indicated by one-dot line. The digital data D1$b$ shown in FIG. 24 is the digital data at the position "b'" shown in FIG. 7B, likewise, D2$b$ at "d'" and D3$b$ at "f'".

Figure 24:
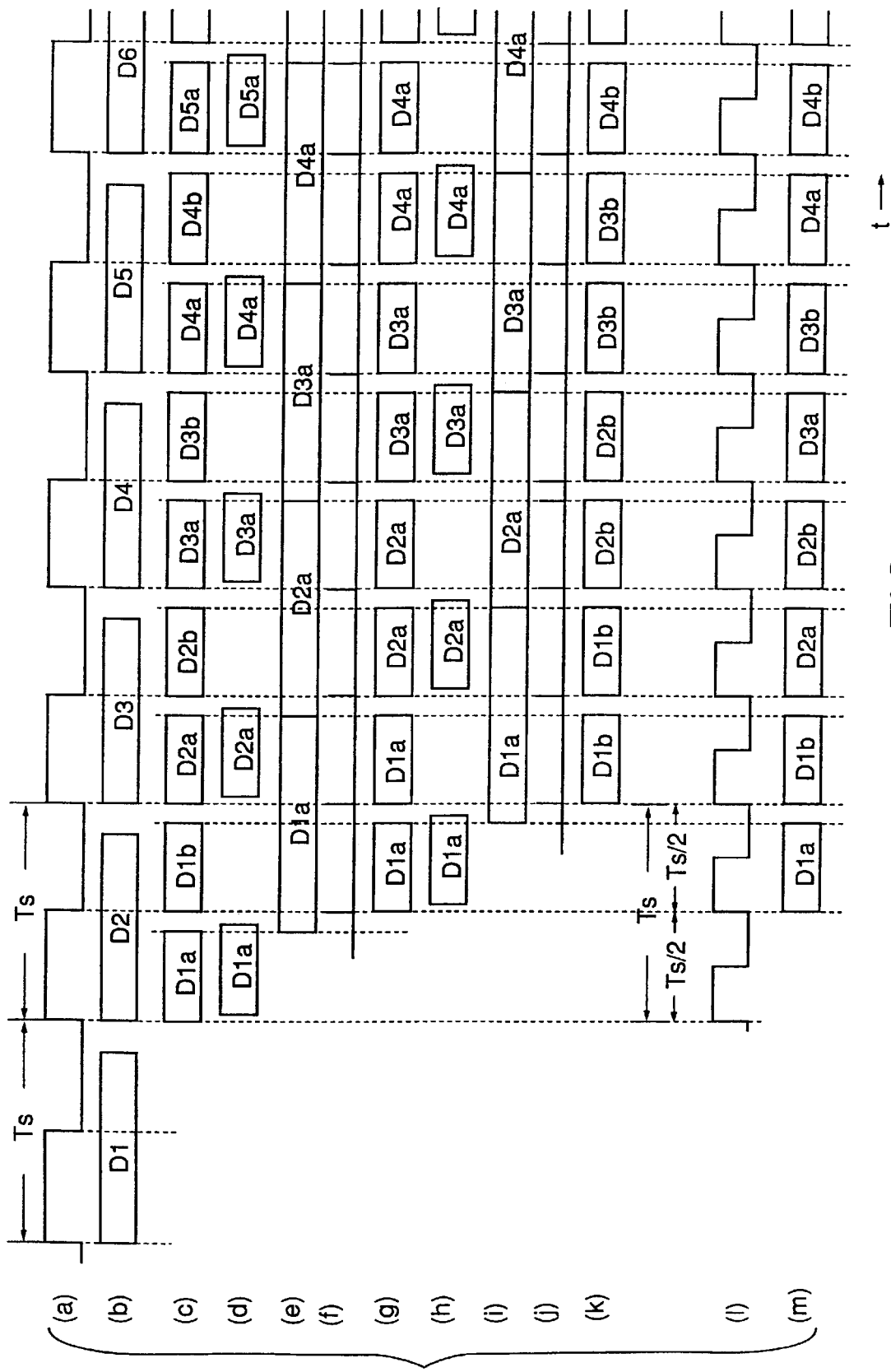
FIGS. 24(a) to 24(m) are a series of waveform diagrams for assistance in explaining the function of the signal processing apparatus shown in FIGS. 23A and 23B.

Here, the N-bit coded data (digital data) to be subjected to signal processing supplied sequentially per time Ts to the oversamplin( filter 200 are digital data D1→D2→D3 . . . as shown in FIG. 24($b$). In this case, the digital data delayed by one sampling period Ts and sequentially output from the filter 200 are the digital data D1$a$→D1$b$→D2$a$→D2$b$→D3$a$→D3$b$ . . . per time Ts/2 as shown in FIG. 24($c$).

The digital data sequentially output from the oversampling filter 200 per period Ts/2 as shown in FIG. 24($b$) are divided into two digital data trains. The first digital data train is composed of odd numbers of data D1$a$→D2$a$→D3$a$ . . . with sampling period Ts as shown in FIG. 24($d$). And, the second digital data train is composed of even numbers of data D1$b$→D2$b$→D3$b$ . . . with sampling period Ts as shown in FIG. 24($h$).

The first and the second digital data train are supplied to a first and a second cyclic data generator 300A and 300B, respectively. The generators 300A and 300B output cyclic data of K number of N-bit coded data with sampling period Ts/K (K: a natural number of two or more) appearing on the time axis. FIG. 24(*l*) shows the sampling period in case of K=2.

The first (the second, cyclic data generator 300A (300B) can be configured the as the cyclic generator 2 as shown in FIG. 4. The generator 300A converts the first digital data train of D1a→D2a→D3a . . . input via input terminal 300a into digital data D1a, D1a, D2a, D2a, D3a, D3a . . . in which two (K=2) same data of sampling period Ts/2 are sequentially appear on the time axis as shown in FIG. 24(*g*). Further, the generator 300B converts the second digital data train of D1b→D2b→D3b . . . input via input terminal 300a into digital data D1b, D1b, D2b, D2b, D3b, D3b . . . in which two (K=2) same data of sampling period Ts/2 are sequentially appear on the time axis as shown in FIG. 24(*k*).

The function of the first (the second) cyclic data generator 300A (300B) will be described with reference to FIG. 4. In FIG. 4, the input N-bit serial data of sequential N-bit coded data D1a→D2a→D3a . . . (D1b→D2b→D3b . . . ) are supplied, as shown in FIG. 24(*d*){24(*h*)} to a serial-to-parallel converter 7 by bit clocks B CLK1.

At the moment when it is finished to take the digital data D1a of N-bit serial data, the converter 7 outputs N-bit parallel digital data which are supplied to a latch memory 8. Next is the digital data D2a and so on.

The latch memory 8 latches the N-bit parallel digital data D1a (D1b) as shown in FIG. 24(*e*){24(*i*)} by latch clocks LT CLK at the moment when it is finished that the converter 7 takes the digital data D1a of N-bit serial data. The latch memory 8 then reads the latched data D1a twice during the period Ts and supplies it to a parallel-to-serial converter 9.

The converter 9 loads the N-bit digital data D1a per load clock LD CLK of sampling period Ts/2 supplied thereto as shown in FIGS. 24(*f*) or 24(*j*). Bit clocks B CLK2 also supplied to the converter 9 has the same period as that of the Bit clocks B CLK1 supplied to the serial-to-parallel converter 7. The parallel-to-serial converter 9 then outputs twice the N-bit serial digital data D1a of sampling period Ts/2 during the sampling period Ts of the N-bit coded data to be processed via output terminal 2b (300b in FIGS. 23A or 23B) as shown in FIG. 24(*g*).

When it is required to supply N-bit parallel coded data to a signal processors 400A (400B) to which the cyclic data generator 300A (300B) is connected, the generator 300A (300B) may output twice the N-bit parallel digital data D1a (D1b) of sampling period Ts/2 during the sampling period Ts of the N-bit coded data to be processed without the parallel-to-serial converter 9.

The signal processor 430A (400B) processes cyclic data of sequential two N-bit coded data with the sampling period Ts/2 as shown in FIG. 7B to output cyclic data of sequential two M-bit coded data with the sampling period Ts/2. The configuration and function of the signal processors 400A (400B) are omitted here. Because they are the same as the configuration and function of the signal processor 3 already described with reference to FIGS. 6 to 21.

More in detail, the M-bit coded data output from the signal processor 400A are the cyclic data of sequential two M-bit coded data D1a, D1a→D2a, D2a→D3a, D3a . . . with the sampling period Ts/2 converted from the cyclic data of sequential two N-bit coded data D1a, D1a→D2a, D2a→D3a, D3a . . . with the sampling period Ts/2 as shown in FIG. 24(*g*).

In the same way, the M-bit coded data output from the signal processor 400B are the cyclic data of sequential two M-bit coded data D1b, D1b→D2b, D2b→D3b, D3b . . . with the sampling period Ts/2 converted from the cyclic data of sequential two N-bit coded data D1b, D1b→D2b, D2b→D3b, D3b . . . with the sampling period Ts/2 as shown in FIG. 24(*k*).

In FIG. 23A, the M-bit coded data D1a, D1a→D2a, D2a→D3a, D3a . . . with the sampling period Ts/2 and M-bit coded data D1b, D1b→D2b, D2b→D3b, D3b . . . with the sampling period Ts/2 are respectively output from the signal processors 400A and 400B, and supplied to a data selector 500.

The data selector 500 sequentially and alternatively select the M-bit coded data from the signal processors 400A and 400B and output M-bit data train D1a→D1b→D2a→D2b→D3a→D3b . . . of sampling period Ts/2 via output terminal 700 as shown in FIG. 24(*m*).

Further, in FIG. 23B, the M-bit data train D1a→D1b→D2a→D2b→D3a→D3b . . . of sampling period Ts/2 output from the data selector 500 are supplied to a low-pass filter (LPF) 600. The low-pass filter 4 already described with reference to FIGS. 4 and 22 can be employed as the low-pass filter 600.

The M-bit data train D1a→D1b→D2a→D2b→D3a→D3b . . . of sampling period Ts/2 output from the low-pass filter 600 are supplied to a data decimeter 800. The data decimeter 800 outputs an M-bit data train D1a→D1b→D2a→D2b→D3a→D3b . . . of sampling period Ts. As the data decimeter 800, a decimation filter with a FIR digital filter or a switching circuit, etc., can be employed.

The data decimeter 800 may not be required when the low-pass filter 600 is configured to have a nyquist frequency fs/4 as a cut-off frequency which is determined with respect to a sampling frequency fs/2 corresponding to the sampling period Ts of the N-bit coded data to be processed and to have a function of decimating M-bit coded data of sampling frequency Ts/2 to generate M-bit coded data of sampling frequency Ts.

As described above, the signal processing apparatus shown in FIG. 23A (the third embodiment) outputs the M-bit data train D1a→D1b→D2a→D2b→D3a→D3b . . . of sampling period Ts/2. This can be applied to the case where DAT coded data is required to be processed by a DVD recording/reproducing apparatus.

Further, the signal processing apparatus shown in FIG. 23B (the fourth embodiment) outputs the M-bit data train D1a→D1b→D2a→D2b→D3a→D3b . . . of sampling period Ts. This can be applied to the case where coded data stored in a compact disc is required to be processed by a compact disc recording/reproducing apparatus.

As described above, according to the present invention, it is easy to reproduce audio and video signal of high resolution and quality compared to the conventional bit expansion.

Further, according to the present invention, interpolation is effectively applied to changing digital values which cannot be applied with interpolation to increase the number of bit by the conventional apparatus. Therefore, compared to the conventional apparatus, it is easy to obtain high quality M-bit digital signals.

What is claimed is:

1. A signal processing apparatus for transforming N-bit coded data into M-bit coded data, where M is larger than N, the N-bit coded data being obtained by converting an analog signal into a digital signal in the resolution of $\frac{1}{2^N}$, the apparatus comprising:

a generator to generate first cyclic data of K number sequential N-bit coded data of a sampling period Ts/K in response to input N-bit coded data of a sampling period Ts, where K is a natural number of two or more; and a processor to process the first cyclic data to output second cyclic data of K number sequential M-bit coded data of the sampling period Ts/K.

2. A signal processing apparatus according to claim 1 further comprising a low-pass filter to filter the second cyclic data with a nyquist frequency as a cut-off frequency that depends on a sampling frequency corresponding to the sampling period Ts.

3. A signal processing apparatus according to claim 2 further comprising a decimator to decimate the M-bit coded data of the sampling period Ts/K of the filtered second cyclic data to output M-bit coded data of the sampling period Ts.

4. A signal processing apparatus according to claim 1, wherein the generator comprises:

a serial-to-parallel convertor to convert the input N-bit coded data into N-bit parallel coded data with first clock signals;

a latch memory to latch the N-bit parallel coded data K times; and a parallel-to-serial convertor to load the N-bit parallel coded data with load clock signals of cyclic period Ts/K and convert the N-bit parallel coded data into N-bit serial coded data of the sampling period Ts/K with second clock signals whose cyclic period is 1/k of a cyclic period of the first clock signals, thus outputting K times the N-bit serial coded data.

5. A signal processing apparatus according to claim 1, wherein the processor comprises:

a discriminator to detect signal waveform transition of the first cyclic data and discriminate a signal transition pattern of the signal waveform transition according to predetermined reference transition patterns;

a signal generator to generate (M−N)-bit coded data in response to the discriminated signal transition pattern; and an adder to add the N-bit coded data and the (M−N)-bit coded data to output the M-bit coded data.

6. A signal processing apparatus according to claim 5, wherein the discriminator comprises:

an extractor to extract transition points of the first cyclic data; and an pattern extractor to divide the transition points into transition point groups per sequential first predetermined number of transition points and discriminate the transition pattern of each of the groups to which of a second predetermined number of reference patterns the transition pattern is classified.

7. A signal processing apparatus according to claim 6, wherein the first predetermined number points are a first, a second, a third and a fourth sequential transition points, the signal generator deciding linear interpolation to be applied to a first period between the second and the third transition points in relation to linear interpolation already applied to a second period between the first and the second transition points, conducting operations so that the decided linear interpolation is applied with digital signals in the resolution of $\frac{1}{2^M}$, applying the decided linear interpolation to the first period so that an area of a rectangle formed in the first period in order that transition level corresponds to the resolution 1 LSB of $\frac{1}{2^N}$ and a figure formed by the rectangle and lines indicated by the digital signals of the resolution of $\frac{1}{2^M}$ are almost equal to each other to obtain the (M−N) bit coded data.

8. A signal processing apparatus according to claim 1, wherein the processor comprises:

a discriminator to detect signal waveform transition of the first cyclic data and discriminate a signal transition pattern of the signal waveform transition according to predetermined reference transition patterns;

a signal generator to generate (M−N)-bit coded data and linearly interpolated M-bit coded data in response to the discriminated signal transition pattern;

an offset value generator to generate an offset value to make a step-like waveform of the linearly interpolated M-bit coded data shifted by half of the sampling period Ts/K;

a first adder to add the (M−N)-bit coded data and the offset value;

a detector to detect whether an output of the first adder becomes larger than a predetermined reference value to generate a control signal;

a second adder to add the first cyclic data and the (M−N)-bit coded data or the output of the first adder in response to the control signal, thus outputting the second cyclic data.

9. A signal processing apparatus according to claim 8, wherein the discriminator comprises:

an extractor to extract transition points of the first cyclic data; and an pattern extractor to divide the transition points into transition point groups per sequential first predetermined number of transition points and discriminate the transition pattern of each of the sequential groups to which of a second predetermined number of reference patterns the transition pattern is classified.

10. A signal processing apparatus according to claim 9, wherein the first predetermined number points are a first, a second, a third and a fourth sequential transition points, the signal generator deciding linear interpolation to be applied to a first period between the second and the third transition points in relation to linear interpolation already applied to a second period between the first and the second transition points, conducting operations so that the decided linear interpolation is applied with digital signals in the resolution of $\frac{1}{2^M}$, applying the decided linear interpolation to the first period so that an area of a rectangle formed in the first period in order that transition level corresponds to the resolution 1 LSB of $\frac{1}{2^N}$ and a figure formed by the rectangle and lines indicated by the digital signals of the resolution of $\frac{1}{2^M}$ are almost equal to each other to obtain the (M−N) bit coded data.

11. A signal processing apparatus for transforming N-bit coded data into M-bit coded data, where M is larger than N, the N-bit coded data being obtained by converting an analog signal into a digital signal in the resolution of $\frac{1}{2^N}$, the apparatus comprising:

a sampler to sample input N-bit coded data of a sampling period Ts to generate sequential odd number N-bit coded data of a sampling period Ts/K and sequential even number N-bit coded data of the sampling period Ts/K, where K is a natural number of two or more;

a generator, based on the sequential odd number N-bit coded data and the sequential even number N-bit coded data, to generate first cyclic data of odd number N-bit coded data and second cyclic data of even number N-bit coded data, respectively;

a processor to process the first and the second cyclic data to generate third cyclic data of odd number sequential M-bit coded data of the sampling period Ts/K and fourth cyclic data of even number sequential M-bit coded data of the sampling period Ts/K, respectively; and a selector to sequentially and alternatively select the third and the fourth cyclic data to output fifth cyclic data of K number sequential M-bit coded data of the sampling period Ts/K.

12. A signal processing apparatus according to claim 11 further comprising a low-pass filter to filter the fifth cyclic data with a nyquist frequency as a cut-off frequency that depends on a sampling frequency corresponding to the sampling period Ts.

13. A signal processing apparatus according to claim 12 further comprising a decimator to decimate the M-bit coded data of the sampling period Ts/K of the filtered fifth cyclic data to output M-bit coded data of the sampling period Ts.

14. A signal processing apparatus according to claim 11, wherein the generator comprises:

a serial-to-parallel convertor to convert the sequential odd number N-bit coded data and the sequential even number N-bit coded data into N-bit parallel odd number coded data and N-bit parallel even number coded data, respectively, with first clock signals;

a latch memory to separately latch the N-bit parallel odd and even number coded data K times; and a parallel-to-serial convertor to separately load the N-bit parallel odd and even number coded data with load clock signals of cyclic period Ts/K and convert the N-bit parallel odd and even number coded data into N-bit serial odd number coded data of the sampling period Ts/K and the N-bit serial even number coded data of the sampling period Ts/K, respectively, with second clock signals whose cyclic period is 1/k of a cyclic period of the first clock signals, thus outputting K times the N-bit serial odd and even number coded data as the first and the second cyclic data, respectively.

15. A signal processing apparatus according to claim 11, wherein the processor comprises:

a discriminator to detect signal waveform transition of the first and the second cyclic data and discriminate signal transition patterns of the signal waveform transition according to predetermined reference transition patterns;

a signal generator to generate (M−N)-bit odd number coded data and (M−N) even number coded data in response to the discriminated signal transition patterns; and an adder to add the first cyclic coded data and the (M−N)-bit odd number coded data, and add the second cyclic coded data and the (M−N)-bit even number coded data to output the third and the fourth cyclic data, respectively.

16. A signal processing apparatus according to claim 15, wherein the discriminator comprises:

an extractor to extract first transition points of the first cyclic data and second transition points of the second cyclic data; and an pattern extractor to divide each of the first and the second transition points into transition point groups per sequential first predetermined number of transition points and discriminate the transition pattern of each of the groups to which of a second predetermined number of reference patterns the transition pattern is classified.

17. A signal processing apparatus according to claim 16, wherein the first predetermined number points are a first, a second, a third and a fourth sequential transition points, the signal generator deciding linear interpolation to be applied to a first period between the second and the third transition points in relation to linear interpolation already applied to a second period between the first and the second transition points, conducting operations so that the decided linear interpolation is applied with digital signals in the resolution of $½^M$, applying the decided linear interpolation to the first period so that an area of a rectangle formed in the first period in order that transition level corresponds to the resolution 1 LSB of $½^N$ and a figure formed by the rectangle and lines indicated by the digital signals of the resolution of $½^M$ are almost equal to each other to obtain the (M−N)-bit odd number coded data or the (M−N)-bit even number coded data.

18. A signal processing apparatus according to claim 11, wherein the processor comprises:

a discriminator to detect signal waveform transition of the first and the second cyclic data and discriminate signal transition patterns of the signal waveform transition according to predetermined reference transition patterns;

a signal generator to generate (M−N)-bit odd number coded data and linearly interpolated M-bit odd number coded data, and (M−N)-bit even number coded data and linearly interpolated M-bit even number coded data in response to the discriminated signal transition patterns;

an offset value generator to generate a first offset value to make a step-like waveform of the linearly interpolated M-bit odd number coded data shifted by half of the sampling period Ts/K and a second offset value to make a step-like waveform of the linearly interpolated M-bit even number coded data shifted by half of the sampling period Ts/K;

a first adder to add the (M−N)-bit odd number coded data and the first offset value, and add the (M−N)-bit even number coded data and the second offset value;

a detector to detect whether each of outputs of the first adder becomes larger than a predetermined reference value to generate a control signal;

a second adder to add the first cyclic data and the (M−N)-bit odd number coded data or one of the output of the first adder, and add the second cyclic data and the (M−N)-bit even number coded data or the other output of the first adder in response to the control signal, thus outputting the third and the fourth second cyclic data.

19. A signal processing apparatus according to claim 18, wherein the discriminator comprises:

an extractor to extract first transition points of the first cyclic data and second transition points of the second cyclic data; and an pattern extractor to divide each of the first and the second the transition points into transition point groups per sequential first predetermined number of transition points and discriminate the transition pattern of each group to which of a second predetermined number of reference patterns the transition pattern is classified.

20. A signal processing apparatus according to claim 19, wherein the first predetermined number points are a first, a second, a third and a fourth sequential transition points, the signal generator deciding linear interpolation to be applied to a first period between the second and the third transition points in relation to linear interpolation already applied to a second period between the first and the second transition points, conducting operations so that the decided linear interpolation is applied with digital signals in the resolution of $\frac{1}{2}^M$, applying the decided linear interpolation to the first period so that an area of a rectangle formed in the first period in order that transition level corresponds to the resolution 1 LSB of $\frac{1}{2}^N$ and a figure formed by the rectangle and lines indicated by the digital signals of the resolution of $\frac{1}{2}^M$ are almost equal to each other to obtain the (M–N)-bit odd number coded data and the (M–N)-bit even number coded data.

21. A signal processing method of transforming N-bit coded data into M-bit coded data, where M is larger than N, the N-bit coded data being obtained by converting an analog signal into a digital signal in the resolution of $\frac{1}{2}^N$, the method comprising the steps of:

generating first cyclic data of K number sequential N-bit coded data of a sampling period Ts/K in response to input N-bit coded data of a sampling period Ts, where K is a natural number of two or more; and processing the first cyclic data to output second cyclic data of K number sequential M-bit coded data of the sampling period Ts/K.

22. A signal processing method according to claim 21 further comprising the step of filtering the second cyclic data with a nyquist frequency as a cut-off frequency that depends on a sampling frequency corresponding to the sampling period Ts.

23. A signal processing method according to claim 22 further comprising the step of decimating the M-bit coded data of the sampling period Ts/K of the filtered second cyclic data to output M-bit coded data of the sampling period Ts.

* * * * *